(12) United States Patent
Kato et al.

(10) Patent No.: US 8,892,158 B2
(45) Date of Patent: Nov. 18, 2014

(54) SEMICONDUCTOR DEVICE

(71) Applicant: Semiconductor Energy Laboratory Co., Ltd., Atsugi (JP)

(72) Inventors: Kiyoshi Kato, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/916,666

(22) Filed: Jun. 13, 2013

(65) Prior Publication Data

US 2013/0288619 A1 Oct. 31, 2013

Related U.S. Application Data

(63) Continuation of application No. 12/947,313, filed on Nov. 16, 2010, now Pat. No. 8,467,825.

(30) Foreign Application Priority Data

Nov. 20, 2009 (JP) .................. 2009-265594

(51) Int. Cl.
*H04B 1/28* (2006.01)
*H04M 1/00* (2006.01)
*H04B 7/00* (2006.01)
*H01L 27/06* (2006.01)
*H01L 29/786* (2006.01)
*H04B 1/40* (2006.01)
*H01L 27/12* (2006.01)

(52) U.S. Cl.
CPC .............. *H04B 1/40* (2013.01); *H01L 27/1225* (2013.01); *Y02B 60/50* (2013.01); *H01L 27/0688* (2013.01); *H01L 29/7869* (2013.01)
USPC ...................... 455/550.1; 455/252.1; 455/333

(58) Field of Classification Search
CPC ..... H01L 21/16; H01L 27/1108; H01L 27/127; H01L 27/105; H01L 27/13
USPC ............... 257/43, 51, 67, 69; 455/252.1, 333, 455/550.1
See application file for complete search history.

(56) References Cited

U.S. PATENT DOCUMENTS 5,625,199 A 4/1997 Baumbach et al.
5,694,311 A 12/1997 Umeda et al.
(Continued)

FOREIGN PATENT DOCUMENTS

EP 0 785 578 A2 7/1997
EP 1 737 044 A1 12/2006
(Continued)

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

(Continued)

*Primary Examiner* — Simon Nguyen
(74) *Attorney, Agent, or Firm* — Fish & Richardson P.C.

(57) ABSTRACT

An object is to achieve low power consumption and a long lifetime of a semiconductor device having a wireless communication function. The object can be achieved in such a manner that a battery serving as a power supply source and a specific circuit are electrically connected to each other through a transistor in which a channel formation region is formed using an oxide semiconductor. The hydrogen concentration of the oxide semiconductor is lower than or equal to $5\times10^{19}$ (atoms/cm$^3$). Therefore, leakage current of the transistor can be reduced. As a result, power consumption of the semiconductor device in a standby state can be reduced. Further, the semiconductor device can have a long lifetime.

18 Claims, 19 Drawing Sheets

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,879,990 A * | 3/1999 | Dormans et al. | 438/257 |
| 6,294,274 B1 | 9/2001 | Kawazoe et al. | |
| 6,489,883 B1 | 12/2002 | Iiyama et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,306,981 B2 | 12/2007 | Kuwabara et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,663,165 B2 | 2/2010 | Mouli | |
| 7,674,650 B2 | 3/2010 | Akimoto et al. | |
| 7,675,796 B2 | 3/2010 | Kurokawa | |
| 7,732,819 B2 | 6/2010 | Akimoto et al. | |
| 7,791,074 B2 | 9/2010 | Iwasaki | |
| 7,833,851 B2 | 11/2010 | Kuwabara et al. | |
| 7,851,318 B2 | 12/2010 | Koyama et al. | |
| 7,907,902 B2 | 3/2011 | Kato et al. | |
| 7,940,224 B2 | 5/2011 | Kato | |
| 7,997,499 B2 | 8/2011 | Kato | |
| 8,160,636 B2 | 4/2012 | Tadokoro | |
| 8,289,753 B2 | 10/2012 | Yamazaki et al. | |
| 8,354,674 B2 | 1/2013 | Kimura | |
| 8,421,090 B2 | 4/2013 | Choi | |
| 8,551,838 B2 * | 10/2013 | Kito et al. | 438/257 |
| 2001/0046027 A1 | 11/2001 | Tai et al. | |
| 2002/0056838 A1 | 5/2002 | Ogawa | |
| 2002/0107054 A1 * | 8/2002 | Fujisawa et al. | 455/573 |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0099907 A1 | 5/2004 | Morimoto et al. | |
| 2004/0127038 A1 | 7/2004 | Carcia et al. | |
| 2004/0174072 A1 | 9/2004 | Bourilkov et al. | |
| 2004/0246780 A1 * | 12/2004 | Kawahara et al. | 365/185.28 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0113599 A1 | 6/2006 | Jeong et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0059650 A1 * | 3/2009 | Saito | 365/148 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0160741 A1 | 6/2009 | Inoue et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0193785 A1 | 8/2010 | Kimura | |
| 2010/0276689 A1 | 11/2010 | Iwasaki | |
| 2010/0279462 A1 | 11/2010 | Iwasaki | |
| 2011/0001141 A1 * | 1/2011 | Tanabe | 257/71 |
| 2011/0031997 A1 * | 2/2011 | Or-Bach et al. | 326/37 |
| 2011/0199270 A1 | 8/2011 | Kato | |
| 2012/0195121 A1 * | 8/2012 | Torii et al. | 365/185.05 |
| 2012/0223307 A1 | 9/2012 | Sakata | |
| 2013/0235668 A1 * | 9/2013 | Tanaka et al. | 365/185.17 |

FOREIGN PATENT DOCUMENTS

| | | |
|---|---|---|
| EP | 1 956 524 A2 | 8/2008 |
| EP | 2 006 824 A2 | 12/2008 |
| EP | 2 226847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-339510 A | 12/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152191 A | 5/2003 |
| JP | 2004-103957 A | 4/2004 |

(56) References Cited

FOREIGN PATENT DOCUMENTS

| JP | 2004-228587 A | 8/2004 |
|---|---|---|
| JP | 2004-273614 A | 9/2004 |
| JP | 2004-273732 A | 9/2004 |
| JP | 2006-197277 A | 7/2006 |
| JP | 2006-229558 A | 8/2006 |
| JP | 2007-103918 A | 4/2007 |
| JP | 2007-133558 A | 5/2007 |
| JP | 2007-201437 A | 8/2007 |
| JP | 2007-258226 A | 10/2007 |
| JP | 2007-286150 A | 11/2007 |
| JP | 2008-216529 A | 9/2008 |
| JP | 2008-218989 A | 9/2008 |
| JP | 2009-033145 A | 2/2009 |
| JP | 2009-135350 A | 6/2009 |
| JP | 2009-182978 A | 8/2009 |
| JP | 2009-230763 A | 10/2009 |
| JP | 2009-535819 A | 10/2009 |
| JP | 2011-054936 A | 3/2011 |
| WO | WO 2004/114391 A1 | 12/2004 |
| WO | WO 2007/029844 A1 | 3/2007 |
| WO | 2008/027392 A1 | 3/2008 |

OTHER PUBLICATIONS

Ohara, H et al., "21.3: 4.0 in. QVGA AMOLED Display Using In—Ga—Zn—Oxide TFTS with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display with Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/069240; PCT12933, dated Nov. 30, 2010, 3 pages.

Written Opinion, PCT Application No. PCT/JP2010/069240; PCT12933, dated Nov. 30, 2010, 4 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

(56) References Cited

OTHER PUBLICATIONS

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystaline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 pag.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

\* cited by examiner

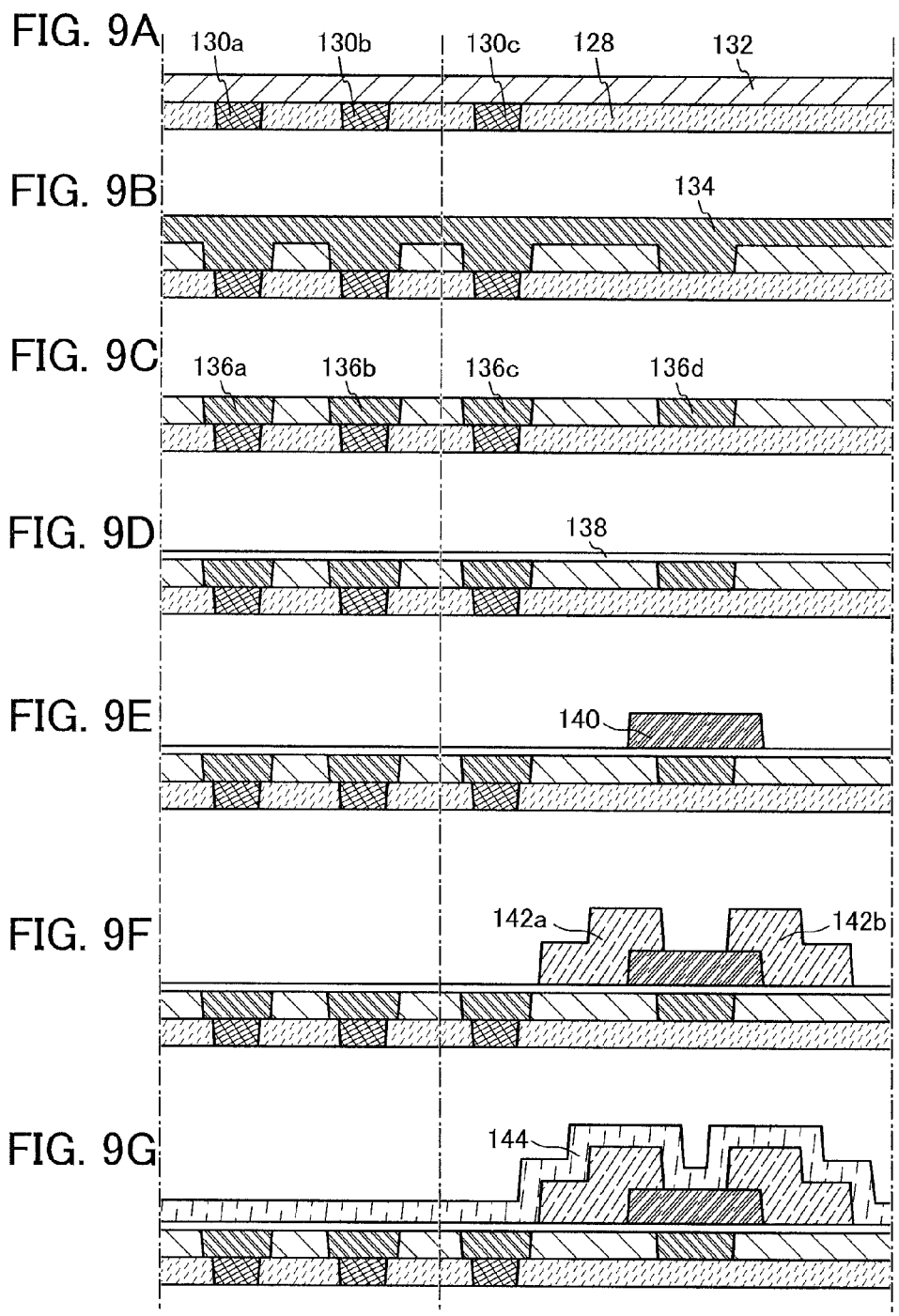

SEMICONDUCTOR DEVICE

CROSS-REFERENCE TO RELATED APPLICATIONS

This application is a continuation of U.S. application Ser. No. 12/947,313, filed Nov. 16, 2010, now allowed, which claims the benefit of a foreign priority application filed in Japan as Serial No. 2009-265594 on Nov. 20, 2009, both of which are incorporated by reference.

TECHNICAL FIELD

The present invention relates to a semiconductor device, in particular, to a semiconductor device having a wireless communication function.

Note that a semiconductor device in this specification refers to all electronic devices which can function by utilizing semiconductor characteristics, and electro-optical devices, semiconductor circuits, and electronic devices are all semiconductor devices.

BACKGROUND ART

Semiconductor devices having wireless communication functions for transmitting and receiving data wirelessly have been put into practical use in a variety of fields. Such semiconductor devices have been expected to further expand the market as a new mode of communication information terminals. In semiconductor devices having wireless communication functions, which are put into practical use, antennas and integrated circuits formed using semiconductor elements are formed over the same substrate. Further, semiconductor devices having wireless communication functions are also referred to as wireless tags, radio frequency (RF) tags, radio frequency identification (RFID) tags, integrated circuit (IC) tags, or identification (ID) tags.

Semiconductor devices are roughly categorized into two types: active semiconductor devices and passive semiconductor devices. The former is a semiconductor device which includes a battery inside the semiconductor device and operates with the battery as a power supply source. The latter is a semiconductor device which does not include a power supply source such as a battery inside the semiconductor device and operates with a signal input from an external interrogator (also referred to as a reader, a reader/writer, or an R/W) as a power supply source.

An active wireless tag incorporates a power supply source; therefore, as compared to a passive wireless tag, a communication distance with an interrogator can be longer. However, the active wireless tag always or regularly operates (generates a signal) regardless of whether or not an answering interrogator exists, so that power consumption is larger.

A technology by which power consumption of the active wireless tag is reduced is disclosed in Patent Document 1. The active wireless tag disclosed in Patent Document 1 includes, in addition to components of the conventional active wireless tag, a second antenna receiving a signal from the outside, an electric generator generating electricity using the signal, and a voltage detection circuit to which an output voltage of the electric generator is input, and intermittent operation is controlled by the voltage detection circuit. Accordingly, power consumption can be reduced.

REFERENCE

Patent Document

[Patent Document 1] Japanese Published Patent Application No. 2006-229558

DISCLOSURE OF INVENTION

However, power consumed by a semiconductor device performing intermittent operation means not only operating power consumption but also standby power consumption (also referred to as standby power). Note that here, standby power means power consumption due to a very small amount of current discharged through an element or a circuit which is electrically connected to a battery. In particular, in the semiconductor device capable of controlling intermittent operation, which is disclosed in Patent Document 1, standby power has a high percentage in total power consumption. Therefore, it is important to reduce standby power for reducing power consumption of the semiconductor device.

Thus, an object of an embodiment of the present invention is to reduce standby power of a semiconductor device.

Further, an object of an embodiment of the present invention is to achieve a long lifetime of a semiconductor device.

The above objects can be achieved in such a manner that a battery serving as a power supply source is electrically connected to a specific circuit through a transistor in which a channel formation region is formed using an oxide semiconductor. Note that the oxide semiconductor is an intrinsic or substantially intrinsic semiconductor by removal of hydrogen serving as an electron donor (donor).

Specifically, the concentration of hydrogen contained in the oxide semiconductor is lower than or equal to $5 \times 10^{19}$ (atoms/cm$^3$), preferably lower than or equal to $5 \times 10^{18}$ (atoms/cm$^3$), more preferably lower than or equal to $5 \times 10^{17}$ (atoms/cm$^3$). When the hydrogen concentration is thus reduced, the carrier density can be lower than $1 \times 10^{14}$ cm$^{-3}$, preferably lower than $1 \times 10^{12}$ cm$^{-3}$, more preferably lower than $1 \times 10^{11}$ cm$^{-3}$ which is lower than or equal to the measurement limit.

When a channel formation region of a transistor is formed using the thus highly purified oxide semiconductor, the transistor can operate so that the drain current of the transistor is smaller than or equal to $1 \times 10^{-13}$ [A] in an off state even with a channel width of 10 mm. That is, leakage current can be significantly reduced by application of a highly purified oxide semiconductor to a channel formation region of a transistor.

An embodiment of the present invention is a semiconductor device including an antenna, a battery, a demodulation circuit demodulating a signal input from the antenna, a signal processing portion operating with the use of a signal input from the demodulation circuit and power supply voltage supplied from the battery, and a power control circuit controlled by a signal input from the demodulation circuit. The signal processing portion includes a transistor in which switching is controlled by a signal input from the power control circuit, and a functional circuit electrically connected to a cathode or an anode of the battery through the transistor. A channel formation region of the transistor is formed using an oxide semiconductor with a hydrogen concentration of lower than or equal to $5 \times 10^{19}$ (atoms/cm$^3$).

The demodulation circuit included in the above structure can be replaced with a timer. That is, another embodiment of the present invention is a semiconductor device including an antenna, a battery, a timer regularly outputting a signal, a signal processing portion operating with the use of a signal input from the timer and power supply voltage supplied from the battery, and a power control circuit controlled by a signal input from the timer. The signal processing portion includes a transistor in which switching is controlled by a signal input from the power control circuit, and a functional circuit electrically connected to a cathode or an anode of the battery through the transistor. A channel formation region of the transistor is formed using an oxide semiconductor with a hydrogen concentration of lower than or equal to $5 \times 10^{19}$ (atoms/cm$^3$).

Further, in the above structure, the battery may be a secondary battery. Another embodiment of the present invention is a semiconductor device including, in addition to the above components, a rectifier circuit rectifying a signal input from the antenna, a charge circuit charging the secondary battery with the use of a signal input from the rectifier circuit, and a stabilizing power supply circuit generating power supply voltage using the secondary battery.

As the functional circuit, a logic gate or the like can be used, for example. The logic gate can be formed using a complementary metal oxide semiconductor (CMOS). Alternatively, the logic gate can be formed using only n-channel metal oxide semiconductor (NMOS).

A semiconductor device of an embodiment of the present invention includes a functional circuit, a battery, and a transistor controlling electrical connection between the functional circuit and the battery. A channel formation region of the transistor is formed using an oxide semiconductor in which the hydrogen concentration is lowered. Specifically, the hydrogen concentration of the oxide semiconductor is lower than or equal to $5 \times 10^{19}$ (atoms/cm$^3$). Therefore, electric discharge through the transistor can be suppressed by turning off the transistor in a standby state. As a result, standby power of the semiconductor device can be reduced. Further, by suppressing electric discharge of the battery in a standby state, the semiconductor device can have a long lifetime.

BRIEF DESCRIPTION OF DRAWINGS

In the accompanying drawings:

FIGS. 9A to 9G are cross-sectional views illustrating an example of a process of manufacturing an n-channel transistor described in Embodiment 5;

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Note that since a source terminal and a drain terminal of a transistor change depending on the structure, the operating condition, and the like of the transistor, it is difficult to define which is a source terminal or a drain terminal. Therefore, in this document, one of a source terminal and a drain terminal is referred to as a first terminal and the other thereof is referred to as a second terminal for distinction.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

In this embodiment, an example of a semiconductor device will be described. Specifically, an example of a semiconductor device having a wireless communication function with a battery as a power supply source will be described with reference to FIG. 1.

Figure 1:
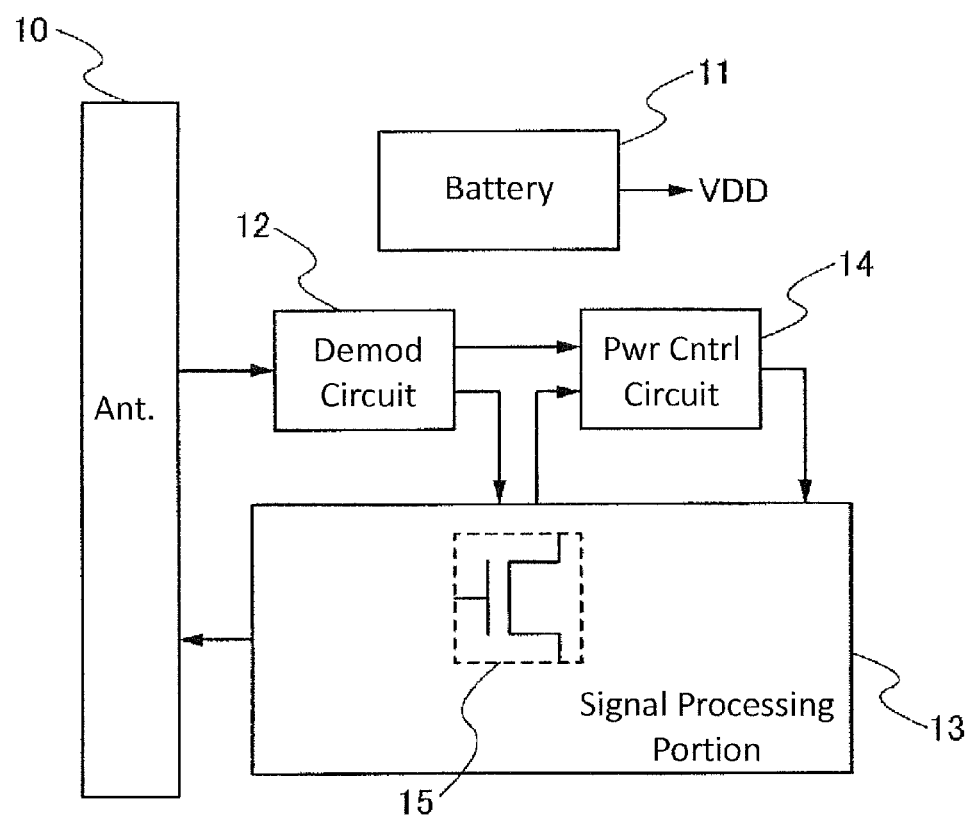
FIG. 1 illustrates a structure example of a semiconductor device described in Embodiment 1.

A semiconductor device illustrated in FIG. 1 includes an antenna 10 capable of transmitting and receiving a wireless signal, a battery 11 serving as a supply source of power supply voltage (VDD), a demodulation circuit 12 demodulating a signal input from the antenna 10, a signal processing portion 13 operating with the use of a signal input from the demodulation circuit 12 and the power supply voltage (VDD) supplied from the battery 11, and a power control circuit 14 controlled by a signal input from the demodulation circuit 12 and a signal input from the signal processing portion 13. Note that in this embodiment, operation means generation of a signal in the signal processing portion 13 or part of the signal processing portion 13.

Further, the signal processing portion 13 includes a transistor 15 in which switching is controlled by a signal input from the power control circuit 14. Specifically, the transistor 15 is controlled by the signal input from the demodulation circuit 12 to the power control circuit 14 so as to be turned on. Similarly, the transistor 15 is controlled by the signal input from the signal processing portion 13 to the power control circuit 14 so as to be turned off.

Further, the signal processing portion 13 includes a functional circuit (not illustrated) operating with the use of a signal input from the demodulation circuit 12 and the power supply voltage (VDD). Note that the transistor 15 is provided between the functional circuit and a cathode or an anode of the battery 11. That is, the functional circuit is electrically connected to the cathode or the anode of the battery 11 through the transistor 15. Further, the functional circuit can operate in a period when the transistor 15 is in an on state.

Further, a channel formation region of the transistor 15 is formed using an oxide semiconductor with a hydrogen concentration of lower than or equal to $5 \times 10^{19}$ (atoms/cm$^3$), preferably lower than or equal to $5 \times 10^{18}$ (atoms/cm$^3$), more preferably lower than or equal to $5 \times 10^{17}$ (atoms/cm$^3$). That is, the transistor 15 is a transistor in which a channel formation region is formed using an oxide semiconductor which is highly purified by reducing the concentration of hydrogen serving as a donor of a carrier to an extremely low level. The hydrogen concentration in the oxide semiconductor layer is measured by secondary ion mass spectrometry (SIMS).

Thus, leakage current of the transistor 15 can be significantly reduced. In addition, in the semiconductor device of this embodiment, the transistor 15 is kept off in a standby state. Accordingly, electric discharge of the battery 11 in the standby state can be suppressed. That is, standby power of the semiconductor device can be reduced. Moreover, the semiconductor device can have a long lifetime by suppressing electric discharge of the battery 11 in the standby state.

Modification Example

Note that the semiconductor device described above is an example of a semiconductor device of this embodiment, and a semiconductor device having a point which is different from the above-described semiconductor device can also be included in this embodiment.

For example, in the semiconductor device described above, the structure is described in which the transistor 15 is provided between the functional circuit and the cathode or the anode of the battery 11; however, the semiconductor device of this embodiment is not limited to the structure. In the semiconductor device of this embodiment, the transistor 15 may be included in the functional circuit. Further, the transistor 15 is not necessarily directly connected to the battery 11. The transistor 15 may be provided in the functional circuit while a function of the functional circuit is kept by changing the order of the transistor 15 and a circuit connected to the transistor 15 in series or another transistor.

Further, in the semiconductor device described above, a structure is described in which the transistor 15 is controlled by the output signal of the signal processing portion 13 so as to be turned off; however, the semiconductor device of this embodiment is not limited to the structure. In the semiconductor device of this embodiment, the transistor 15 may be controlled by the signal input from the demodulation circuit 12 so as to be turned off. Further, a structure may be employed in which the transistor 15 is turned off after a certain period of time when the transistor 15 is turned on.

Note that this embodiment or part of this embodiment can be freely combined with the other embodiments or part of the other embodiments.

Embodiment 2

In this embodiment, an example of a semiconductor device will be described. Specifically, an example of a semiconductor device having a wireless communication function with a battery as a power supply source will be described with reference to FIG. 2.

Figure 2:
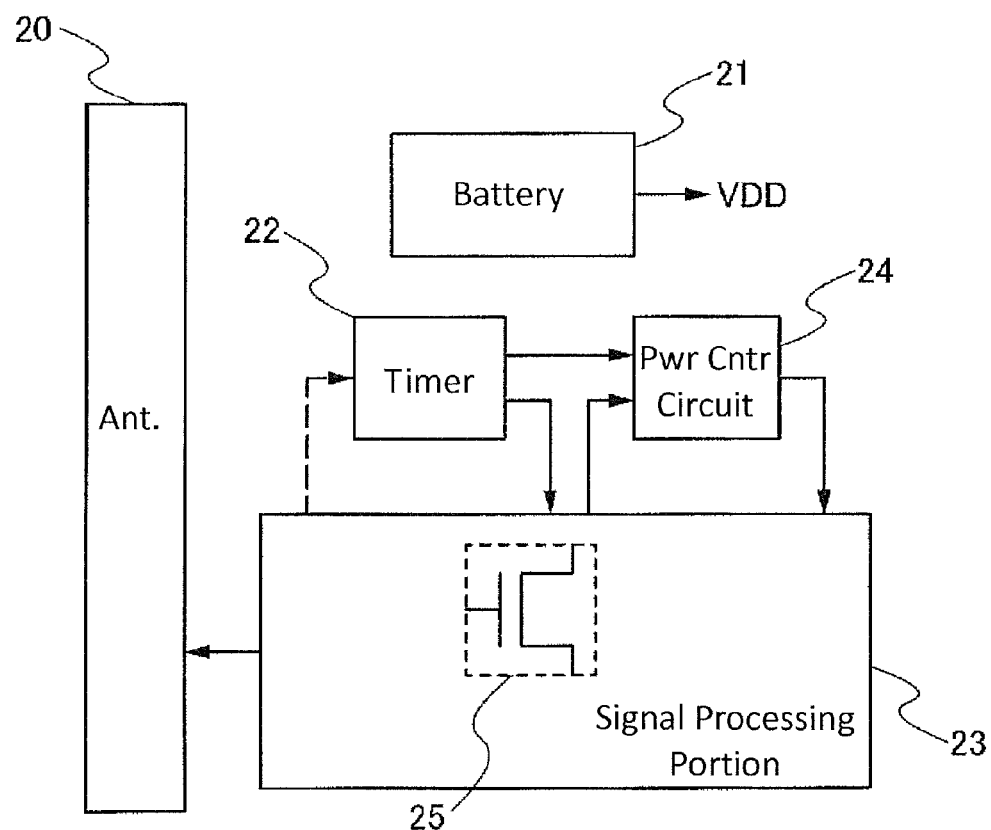
FIG. 2 illustrates a structure example of a semiconductor device described in Embodiment 2.

A semiconductor device illustrated in FIG. 2 includes an antenna 20 capable of transmitting and receiving a wireless signal, a battery 21 serving as a supply source of power supply voltage (VDD), a timer 22 controlling intermittent operation of the semiconductor device by regularly outputting a signal, a signal processing portion 23 operating with the use of a signal input from the timer 22 and the power supply voltage (VDD) supplied from the battery 21, and a power control circuit 24 controlled by a signal input from the timer 22 and a signal input from the signal processing portion 23. Note that in this embodiment, operation means generation of a signal in the signal processing portion 23 or part of the signal processing portion 23.

Further, the signal processing portion 23 includes a transistor 25 in which switching is controlled by a signal input from the power control circuit 24. Specifically, the transistor 25 is controlled by the signal input from the timer 22 to the power control circuit 24 so as to be turned on. Similarly, the transistor 25 is controlled by the signal input from the signal processing portion 23 to the power control circuit 24 so as to be turned off.

Further, the signal processing portion 23 includes a functional circuit (not illustrated) operating with the use of an output signal of the timer 22 and the power supply voltage (VDD). Note that the transistor 25 is provided between the functional circuit and a cathode or an anode of the battery 21. That is, the functional circuit is electrically connected to the cathode or the anode of the battery 21 through the transistor 25. Further, the functional circuit can operate in a period when the transistor 25 is in an on state.

Further, a channel formation region of the transistor 25 is formed using an oxide semiconductor with a hydrogen concentration of lower than or equal to $5 \times 10^{19}$ (atoms/cm$^3$), preferably lower than or equal to $5 \times 10^{18}$ (atoms/cm$^3$), more preferably lower than or equal to $5 \times 10^{17}$ (atoms/cm$^3$). That is, the transistor 25 is a transistor in which a channel formation region is formed using an oxide semiconductor which is highly purified by reducing the concentration of hydrogen serving as a donor of a carrier to an extremely low level. The hydrogen concentration in the oxide semiconductor layer is measured by secondary ion mass spectrometry (SIMS).

Thus, leakage current of the transistor 25 can be significantly reduced. In addition, in the semiconductor device of this embodiment, the transistor 25 is kept off in a standby state. Accordingly, electric discharge of the battery 21 in the standby state can be suppressed. That is, standby power of the semiconductor device can be reduced. Moreover, the semiconductor device can have a long lifetime by suppressing electric discharge of the battery 21 in the standby state.

Modification Example

Note that the semiconductor device described above is an example of a semiconductor device of this embodiment, and a semiconductor device having a point which is different from the above-described semiconductor device can also be included in this embodiment.

For example, in the semiconductor device described above, the structure is described in which the output signal of the timer 22 is input to the signal processing portion 23 and the power control circuit 24; however, the semiconductor device of this embodiment is not limited to the structure. In the semiconductor device of this embodiment, the output signal of the timer 22 may be input to only the power control circuit. Further, an output signal of the signal processing portion 23 may be input to the timer 22. For example, the signal processing portion 23 outputs a reset signal which is input to the timer 22, and thus timing of the next operation can be controlled.

Note that this embodiment or part of this embodiment can be freely combined with the other embodiments or part of the other embodiments.

Embodiment 3

In this embodiment, an example of a semiconductor device will be described. Specifically, an example of a semiconductor device having a wireless communication function with a secondary battery as a power supply source will be described with reference to FIG. 3.

Figure 3:
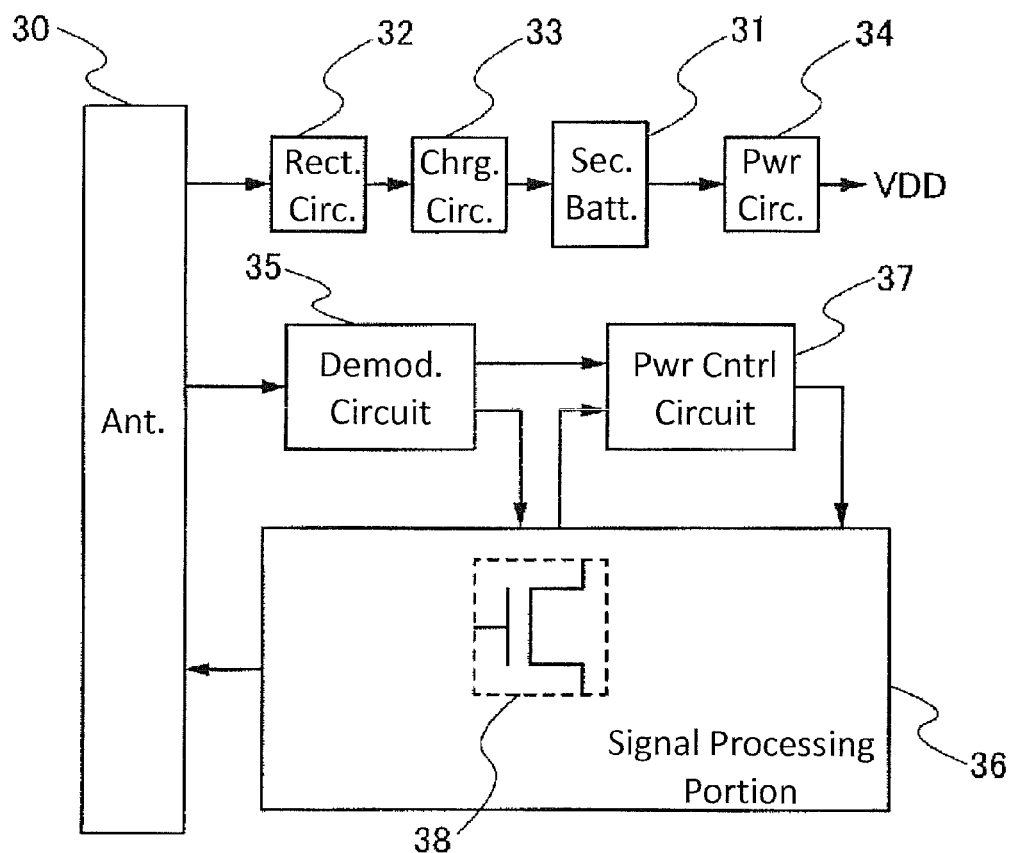
FIG. 3 illustrates a structure example of a semiconductor device described in Embodiment 3.

A semiconductor device illustrated in FIG. 3 includes an antenna 30 capable of transmitting and receiving a wireless signal, a secondary battery 31 serving as a power supply source, a rectifier circuit 32 rectifying a signal input from the antenna 30, a charge circuit 33 charging the secondary battery 31 with the use of a signal input from the rectifier circuit 32, a stabilizing power supply circuit 34 generating power supply voltage (VDD) used in the semiconductor device with the use of the secondary battery 31, a demodulation circuit 35 demodulating a signal input from the antenna 30, a signal processing portion 36 operating with the use of a signal input from the demodulation circuit 35 and the power supply voltage (VDD) supplied from the stabilizing power supply circuit 34, and a power control circuit 37 controlled by a signal input from the demodulation circuit 35 and a signal input from the signal processing portion 36. Note that in this embodiment, operation means generation of a signal in the signal processing portion 36 or part of the signal processing portion 36.

Further, the signal processing portion 36 includes a transistor 38 in which switching is controlled by a signal input from the power control circuit 37. Specifically, the transistor 38 is controlled by the signal input from the demodulation circuit 35 to the power control circuit 37 so as to be turned on. Similarly, the transistor 38 is controlled by the signal input from the signal processing portion 36 to the power control circuit 37 so as to be turned off.

Further, the signal processing portion 36 includes a functional circuit (not illustrated) operating with the use of the signal input from the demodulation circuit 35 and the power supply voltage (VDD). Note that the transistor 38 is provided between the functional circuit and the stabilizing power supply circuit 34. That is, the functional circuit is electrically connected to a cathode or an anode of the secondary battery 31 through the transistor 38 and the stabilizing power supply circuit 34. Further, the functional circuit can operate in a period when the transistor 38 is in an on state.

Further, a channel formation region of the transistor 38 is formed using an oxide semiconductor with a hydrogen concentration of lower than or equal to $5 \times 10^{19}$ (atoms/cm$^3$), preferably lower than or equal to $5 \times 10^{18}$ (atoms/cm$^3$), more preferably lower than or equal to $5 \times 10^{17}$ (atoms/cm$^3$). That is, the transistor 38 is a transistor in which a channel formation region is formed using an oxide semiconductor which is highly purified by reducing the concentration of hydrogen serving as a donor of a carrier to an extremely low level. The hydrogen concentration in the oxide semiconductor layer is measured by secondary ion mass spectrometry (SIMS).

Thus, leakage current of the transistor 38 can be significantly reduced. In addition, in the semiconductor device of this embodiment, the transistor 38 is kept off in a standby state. Accordingly, electric discharge of the secondary battery 31 in the standby state can be suppressed. That is, standby power of the semiconductor device can be reduced. Moreover, the semiconductor device can have a long lifetime by suppressing electric discharge of the secondary battery 31 in the standby state.

Further, in the semiconductor device illustrated in FIG. 3, the secondary battery 31 can be charged by a signal input from the antenna 30. Note that the semiconductor device can perform charging while operating and can perform charging with the use of the signal input from the antenna 30 in a standby state.

Further, in the semiconductor device, the battery cannot run out as long as the battery is continuously charged with power which is approximately equivalent to standby power. Moreover, the semiconductor device includes the transistor 38 as described above, so that standby power can be reduced. Accordingly, the distance that the semiconductor device can perform charging can be improved. The semiconductor device of this embodiment, which has such characteristics, is effective particularly in a place of difficult access (e.g., in a human body, in a space where radioactivity or a powerful medicine exists, or in a vacuum space).

Modification Example

Note that the semiconductor device described above is an example of a semiconductor device of this embodiment, and a semiconductor device having a point which is different from the above-described semiconductor device can also be included in this embodiment.

For example, in the semiconductor device described above, the structure is described in which the antenna 30 is included and transmitting and receiving the wireless signal and charging the secondary battery 31 are performed with the use of the antenna 30; however, the semiconductor device of this embodiment is not limited to the structure. In the semiconductor device of this embodiment, a structure may be employed in which an antenna for transmitting and receiving a wireless signal and an antenna for charging the secondary battery 31 are separately provided.

Note that this embodiment or part of this embodiment can be freely combined with the other embodiments or part of the other embodiments.

Embodiment 4

In this embodiment, an example of a semiconductor device will be described. Specifically, an example of a semiconductor device having a wireless communication function with a secondary battery as a power supply source will be described with reference to FIG. 4.

Figure 4:
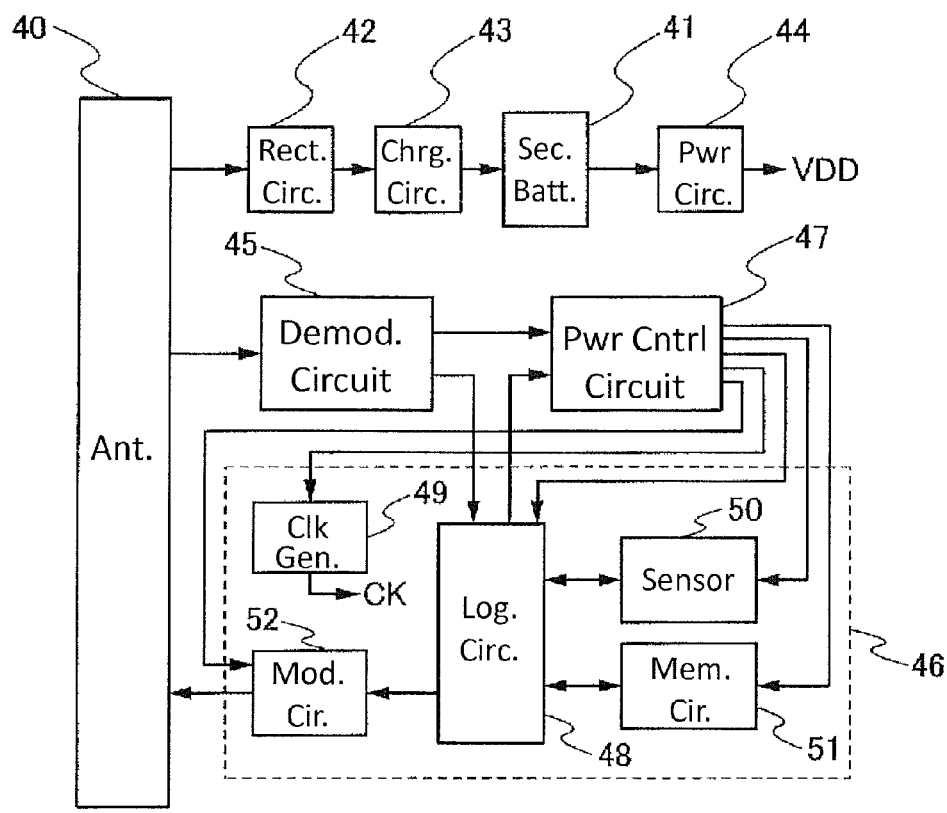
FIG. 4 illustrates a structure example of a semiconductor device described in Embodiment 4.

A semiconductor device illustrated in FIG. 4 includes an antenna 40 capable of transmitting and receiving a wireless signal, a secondary battery 41 serving as a power supply source, a rectifier circuit 42 rectifying a signal input from the antenna 40, a charge circuit 43 charging the secondary battery 41 with the use of an output signal of the rectifier circuit 42, a stabilizing power supply circuit 44 generating power supply voltage (VDD) used in the semiconductor device with the use of the secondary battery 41, a demodulation circuit 45 demodulating a signal input from the antenna 40, a signal processing portion 46 operating with the use of a signal input from the demodulation circuit 45 and the power supply voltage (VDD) supplied from the stabilizing power supply circuit 44, and a power control circuit 47 controlled by a signal input from the demodulation circuit 45 and a signal input from the signal processing portion 46. Note that in this embodiment, operation means generation of a signal in the signal processing portion 46 or part of the signal processing portion 46.

The signal processing portion 46 includes a logic circuit 48 performing processing with the use of the signal input from the demodulation circuit 45, a clock generation circuit 49 generating a clock signal (CK) used in the semiconductor device, a sensor 50 converting specific external data into a signal, a memory circuit 51 storing data, and a modulation circuit 52 performing load modulation on the antenna 40. Note that a standby signal (Stdby) output from the power control circuit 47 is input to each of the logic circuit 48, the clock generation circuit 49, the sensor 50, the memory circuit 51, and the modulation circuit 52.

Each of the circuits included in the semiconductor device of this embodiment includes a transistor. Here, a specific example of a circuit structure of a logic gate (an inverter (a NOT gate), a NOR gate, or a NAND gate) included in the logic circuit 48 will be described with reference to FIGS. 5A to 5C.

Figure 5A:
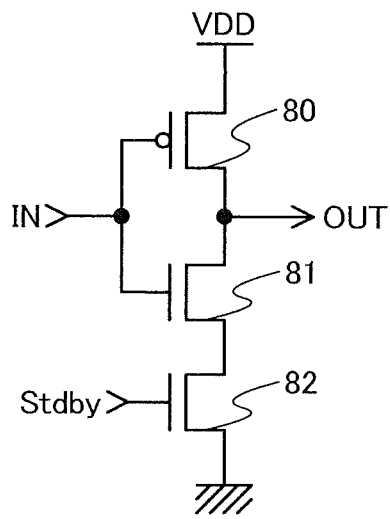
FIGS. 5A to 5C each illustrate a structure example of a logic gate included in a semiconductor device described in Embodiment 4.

FIG. 5A is a specific example of a circuit structure of an inverter. The inverter illustrated in FIG. 5A includes a p-channel transistor 80, an n-channel transistor 81, and an n-channel transistor 82.

A first terminal of the p-channel transistor 80 is electrically connected to a wiring supplying power supply voltage (VDD).

A first terminal of the n-channel transistor 81 is electrically connected to a second terminal of the p-channel transistor 80.

A gate terminal of the n-channel transistor 82 is electrically connected to a wiring supplying a standby signal (Stdby), a first terminal of the n-channel transistor 82 is electrically connected to a second terminal of the n-channel transistor 81, and a second terminal of the n-channel transistor 82 is grounded.

Note that in the inverter illustrated in FIG. 5A, an input signal is input to each of gate terminals of the p-channel transistor 80 and the n-channel transistor 81, and a potential of a node where the second terminal of the p-channel transistor 80 and the first terminal of the n-channel transistor 81 are electrically connected to each other is output as an output signal of the inverter.

Figure 5B:
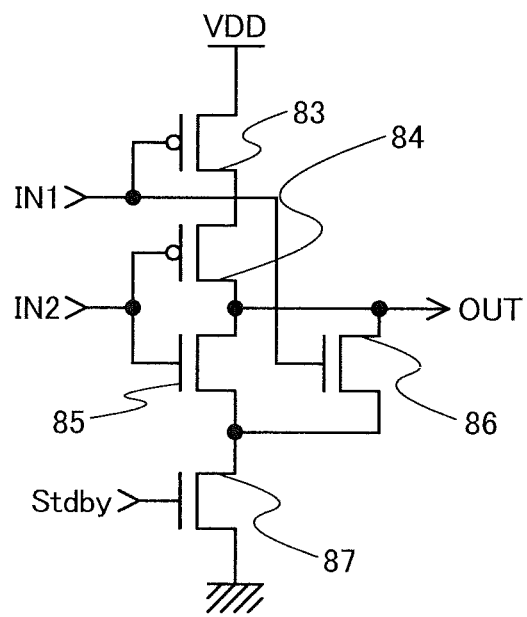

FIG. 5B is a specific example of a circuit structure of a NOR gate. The NOR gate illustrated in FIG. 5B includes a p-channel transistor 83, a p-channel transistor 84, an re-channel transistor 85, an n-channel transistor 86, and an n-channel transistor 87.

A first terminal of the p-channel transistor 83 is electrically connected to a wiring supplying power supply voltage (VDD).

A first terminal of the p-channel transistor 84 is electrically connected to a second terminal of the p-channel transistor 83.

A first terminal of the n-channel transistor 85 is electrically connected to a second terminal of the p-channel transistor 84.

A first terminal of the n-channel transistor 86 is electrically connected to the second terminal of the p-channel transistor 84 and the first terminal of the n-channel transistor 85.

A gate terminal of the n-channel transistor 87 is electrically connected to a wiring supplying a standby signal (Stdby), a first terminal of the n-channel transistor 87 is electrically connected to a second terminal of the n-channel transistor 85 and a second terminal of the n-channel transistor 86, and a second terminal of the n-channel transistor 87 is grounded.

Note that in the NOR gate illustrated in FIG. 5B, a first input signal is input to each of gate terminals of the p-channel transistor 83 and the n-channel transistor 86, and a second input signal is input to each of gate terminals of the p-channel transistor 84 and the re-channel transistor 85. Further, a potential of a node where the second terminal of the p-channel transistor 84, the first terminal of the n-channel transistor 85, and the first terminal of the n-channel transistor 86 are electrically connected to each other is output as an output signal of the NOR gate.

Figure 5C:
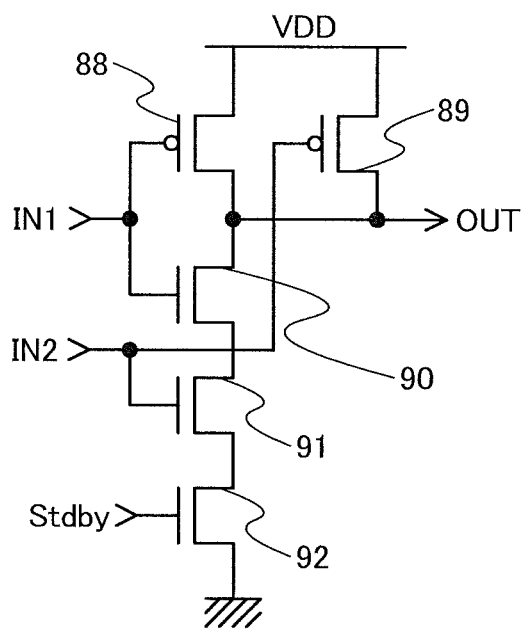

FIG. 5C is a specific example of a circuit structure of a NAND gate. The NAND gate illustrated in FIG. 5C includes a p-channel transistor 88, a p-channel transistor 89, an n-channel transistor 90, an n-channel transistor 91, and an n-channel transistor 92.

A first terminal of the p-channel transistor 88 is electrically connected to a wiring supplying power supply voltage (VDD).

A first terminal of the p-channel transistor 89 is electrically connected to the wiring supplying the power supply voltage (VDD).

A first terminal of the n-channel transistor 90 is electrically connected to a second terminal of the p-channel transistor 88 and a second terminal of the p-channel transistor 89.

A first terminal of the n-channel transistor 91 is electrically connected to a second terminal of the n-channel transistor 90.

A gate terminal of the n-channel transistor 92 is electrically connected to a wiring supplying a standby signal (Stdby), a first terminal of the n-channel transistor 92 is electrically connected to a second terminal of the n-channel transistor 91, and a second terminal of the n-channel transistor 92 is grounded.

Note that in the NAND gate illustrated in FIG. 5C, a first input signal is input to each of gate terminals of the p-channel transistor 88 and the n-channel transistor 90, and a second input signal is input to each of gate terminals of the p-channel transistor 89 and the n-channel transistor 91. Further, a potential of a node where the second terminal of the p-channel transistor 88, the second terminal of the p-channel transistor 89, and the first terminal of the n-channel transistor 90 are electrically connected to each other is output as an output signal of the NAND gate.

Each of the logic gates described above includes a transistor (the n-channel transistor 82, the n-channel transistor 87, or the n-channel transistor 92) which controls electrical connection with a wiring supplying a ground potential. Further, in each of the logic gates, a channel formation region of the transistor is formed using an oxide semiconductor with a hydrogen concentration of lower than or equal to $5 \times 10^{19}$ (atoms/cm$^3$), preferably lower than or equal to $5 \times 10^{18}$ (atoms/cm$^3$), more preferably lower than or equal to $5 \times 10^{17}$ (atoms/cm$^3$). Thus, leakage current of the transistor can be significantly reduced. Accordingly, through current flowing through the logic gate can be reduced. As a result, standby power of the semiconductor device can be reduced.

Note that the structure is described here in which each of the logic gates includes the transistor controlling input of the ground potential; however, a structure may be employed in which one transistor controls input of ground potentials to a plurality of logic gates.

Figure 6A:
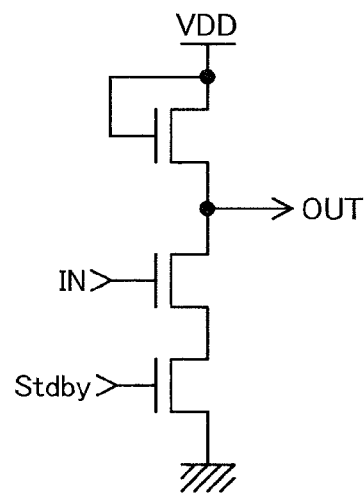
FIGS. 6A to 6C each illustrate a structure example of a logic gate included in a semiconductor device described in Embodiment 4.
Figure 6B:
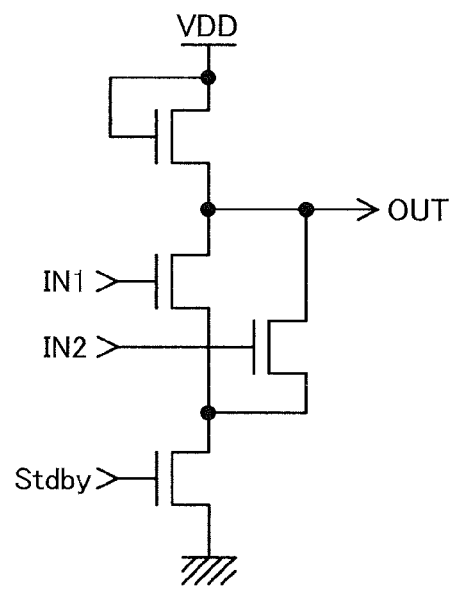
Figure 6C:
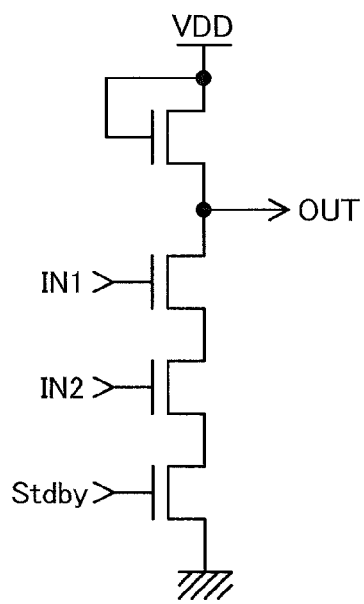

Although the structure examples are described in which the logic circuits are formed using complementary metal oxide semiconductors (CMOS) in the above description, a semiconductor device of this embodiment can be formed using only re-channel transistors. FIGS. 6A to 6C are each a logic gate formed using only n-channel transistors. FIG. 6A is an inverter, FIG. 6B is a NOR gate, and FIG. 6C is a NAND gate. To put it simply, each of the logic gates illustrated in FIGS. 6A to 6C has a structure in which the p-channel transistors included in the logic gates illustrated in FIGS. 5A to 5C are replaced with diode-connected n-channel transistors.

As described above, each of the logic gates illustrated in FIGS. 6A to 6C includes, as a transistor for controlling electrical connection with a wiring supplying a ground potential, a transistor in which a channel formation region is formed using an oxide semiconductor with a hydrogen concentration of lower than or equal to $5\times10^{19}$ (atoms/cm$^3$), preferably lower than or equal to $5\times10^{18}$ (atoms/cm$^3$), more preferably lower than or equal to $5\times10^{17}$ (atoms/cm$^3$). Thus, leakage current of the transistor can be significantly reduced. Accordingly, through current flowing through the logic gate can be reduced. As a result, standby power of the semiconductor device can be reduced.

Further, in the clock generation circuit 49, the sensor 50, the memory circuit 51, and the modulation circuit 52, a transistor in which switching is controlled by the power control circuit 47 may be provided between the circuit and a wiring supplying a ground potential or between the circuit and a wiring supplying power supply potential (VDD), based on the conventional circuit structure. Furthermore, a transistor controlled by the power control circuit 47 may be provided for each block of the conventional circuit. Alternatively, a transistor controlled by the power control circuit 47 may be provided for each functional circuit.

Note that this embodiment or part of this embodiment can be freely combined with the other embodiments or part of the other embodiments.

Embodiment 5

In this embodiment, an example of a transistor included in the semiconductor device described in any of Embodiments 1 to 4 is described. Specifically, an example is described in which a transistor formed using a substrate containing a semiconductor material is used as a p-channel transistor included in the semiconductor device, and a transistor formed using an oxide semiconductor is used as an n-channel transistor included in the semiconductor device.

Structural Example

Figure 7:
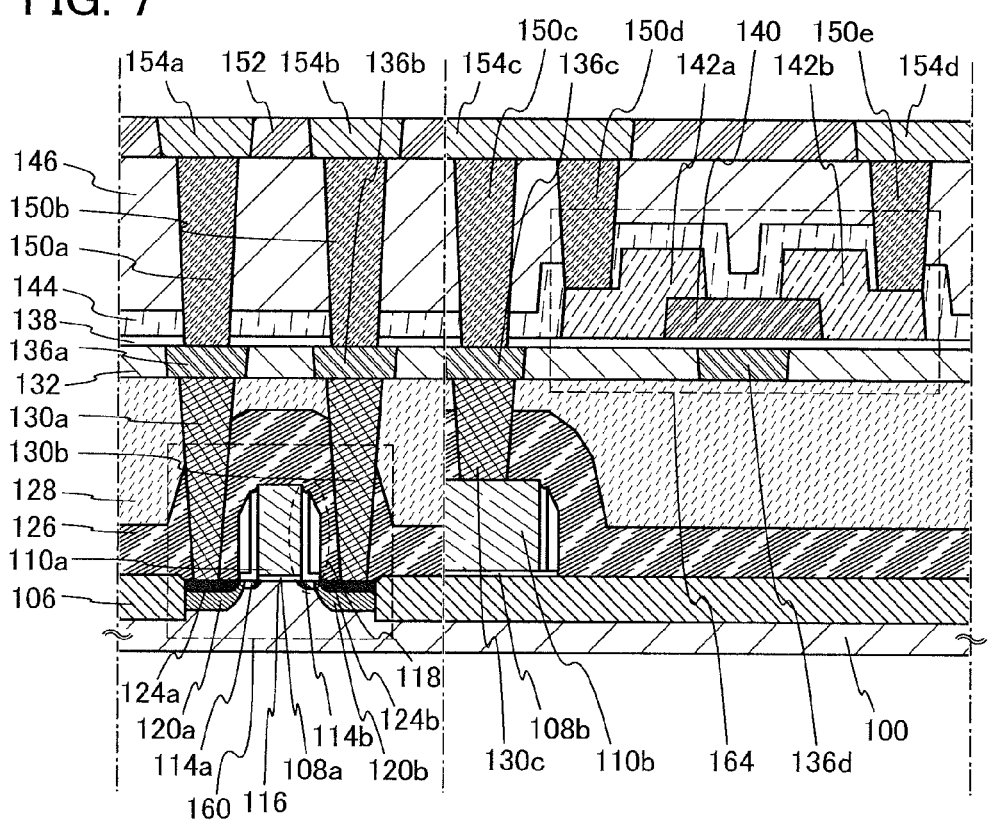
FIG. 7 is a cross-sectional view illustrating a structure example of a p-channel transistor and an n-channel transistor described in Embodiment 5.

A p-channel transistor and an n-channel transistor included in the semiconductor device of this embodiment are shown in FIG. 7.

A p-channel transistor 160 illustrated in FIG. 7 includes a channel formation region 116 provided over a substrate 100 including a semiconductor material, a pair of impurity regions 114a and 114b and a pair of high concentration impurity regions 120a and 120b (these regions are also collectively referred to simply as impurity regions) between which the channel formation region 116 is interposed, a gate insulating layer 108a provided over the channel formation region 116, a gate electrode layer 110a provided over the gate insulating layer 108a, a source electrode layer 130a which is electrically connected to the impurity region 114a, and a drain electrode layer 130b which is electrically connected to the impurity region 114b.

Note that sidewall insulating layers 118 are provided on side surfaces of the gate electrode layer 110a. The substrate 100 including a semiconductor material is provided with the pair of high concentration impurity regions 120a and 120b in regions which do not overlap with the sidewall insulating layers 118. The substrate 100 is also provided with a pair of metal compound regions 124a and 124b over the pair of high concentration impurity regions 120a and 120b. Further, element isolation insulating layers 106 are provided over the substrate 100 so as to surround the p-channel transistor 160, and an interlayer insulating layer 126 and an interlayer insulating layer 128 are provided so as to cover the p-channel transistor 160. The source electrode layer 130a and the drain electrode layer 130b are electrically connected to the metal compound region 124a and the metal compound region 124b, respectively, through openings formed in the interlayer insulating layer 126 and the interlayer insulating layer 128. That is, the source electrode layer 130a is electrically connected to the high concentration impurity region 120a and the impurity region 114a through the metal compound region 124a, and the drain electrode layer 130b is electrically connected to the high concentration impurity region 120b and the impurity region 114b through the metal compound region 124b.

In addition, as layers below an n-channel transistor 164 described later, an insulating layer 108b formed using the same material from which the gate insulating layer 108a is formed, an electrode layer 110b formed using the same material as the gate electrode layer 110a, and an electrode layer 130c formed using the same material as the source electrode layer 130a and the drain electrode layer 130b are provided.

The n-channel transistor 164 illustrated in FIG. 7 includes a gate electrode layer 136d provided over the interlayer insulating layer 128, a gate insulating layer 138 provided over the gate electrode layer 136d, an oxide semiconductor layer 140 provided over the gate insulating layer 138, and a source electrode layer 142a and a drain electrode layer 142b which are provided over the oxide semiconductor layer 140 and electrically connected to the oxide semiconductor layer 140.

Here, the gate electrode layer 136d is provided so as to be embedded in an insulating layer 132 formed over the interlayer insulating layer 128. In a manner similar to the gate electrode layer 136d, an electrode layer 136a and an electrode layer 136b which are respectively in contact with the source electrode layer 130a and the drain electrode layer 130b included in the p-channel transistor 160 are formed. In addition, an electrode layer 136c in contact with the electrode layer 130c is formed.

Over the n-channel transistor 164, a protective insulating layer 144 is provided to be partly in contact with the oxide semiconductor layer 140, and an interlayer insulating layer 146 is provided over the protective insulating layer 144. Here, openings reaching the source electrode layer 142a and the drain electrode layer 142b are provided in the protective insulating layer 144 and the interlayer insulating layer 146. An electrode layer 150d and an electrode layer 150e are formed, which are respectively in contact with the source electrode layer 142a and the drain electrode layer 142b through the openings. In a manner similar to the electrode layer 150d and the electrode layer 150e, an electrode layer 150a, an electrode layer 150b, and an electrode layer 150c are formed, which are respectively in contact with the electrode layer 136a, the electrode layer 136b, and the electrode layer 136c through openings provided in the gate insulating layer 138, the protective insulating layer 144, and the interlayer insulating layer 146.

The oxide semiconductor layer 140 is highly purified by sufficiently removing an impurity such as hydrogen therein. Specifically, the hydrogen concentration of the oxide semiconductor layer 140 is lower than or equal to $5 \times 10^{19}$ (atoms/cm$^3$). Note that the preferable hydrogen concentration of the oxide semiconductor layer 140 is lower than or equal to $5 \times 10^{18}$ (atoms/cm$^3$), and the much preferable concentration is lower than or equal to $5 \times 10^{17}$ (atoms/cm$^3$). When the highly purified oxide semiconductor layer 140 in which the hydrogen concentration is sufficiently reduced is used, the n-channel transistor 164 having an excellent off-current characteristic can be obtained. Applying the highly purified oxide semiconductor layer 140 in which the hydrogen concentration is sufficiently reduced allows reduction in leak current in the n-channel transistor 164. The hydrogen concentration in the oxide semiconductor layer 140 is measured by secondary ion mass spectrometry (SIMS).

Further, an insulating layer 152 is provided over the interlayer insulating layer 146, and an electrode layer 154a, an electrode layer 154b, an electrode layer 154c, and an electrode layer 154d are provided so as to be embedded in the insulating layer 152. Note that the electrode layer 154a is in contact with the electrode layer 150a, the electrode layer 154b is in contact with the electrode layer 150b, the electrode layer 154c is in contact with the electrode layer 150c and the electrode layer 150d, and the electrode layer 154d is in contact with the electrode layer 150e.

The source electrode layer 130a in the p-channel transistor 160 of this embodiment is electrically connected to the electrode layers 136a, 150a, and 154a provided in the upper region. Thus, conductive layers for the above-described electrode layers are formed as appropriate, whereby the source electrode layer 130a in the p-channel transistor 160 can be electrically connected to any of electrode layers included in the n-channel transistor 164 provided in the upper region. The drain electrode layer 130b in the p-channel transistor 160 can also be electrically connected to any of electrode layers included in the n-channel transistor 164 provided in the upper region. Although not illustrated in FIG. 7, the gate electrode layer 110a in the p-channel transistor 160 can be electrically connected to any of electrode layers included in the n-channel transistor 164 through an electrode layer provided in the upper region.

Similarly, the source electrode layer 142a in the n-channel transistor 164 of this embodiment is electrically connected to the electrode layers 130c and 110b provided in the lower region. Thus, conductive layers for the above-described electrode layers are formed as appropriate, whereby the source electrode layer 142a in the n-channel transistor 164 can be electrically connected to the gate electrode layer 110a, the source electrode layer 130a, or the drain electrode layer 130b of the p-channel transistor 160 provided in the lower region. Although not illustrated in FIG. 7, the gate electrode layer 136d or the drain electrode layer 142b in the n-channel transistor 164 can be electrically connected to any of electrode layers included in the p-channel transistor 160 through an electrode layer provided in the lower region.

When the p-channel transistor 160 and the n-channel transistor 164 described above are provided as appropriate, a variety of circuits can be provided. Note that all n-channel transistors 164 included in the circuit are not necessarily to be transistors including an oxide semiconductor, but the n-channel transistors 164 can have different structures depending on characteristics required for each transistor. For example, as an n-channel transistor provided in a logic gate in a semiconductor device, a transistor formed using a substrate including a semiconductor material can be employed, and as an n-channel transistor which controls electrical connection between the logic gate and an anode of a battery, a transistor formed using an oxide semiconductor can be employed.

[Example of Manufacturing Steps]

Next, examples of manufacturing methods of the p-channel transistor 160 and the re-channel transistor 164 are described. Hereinafter, a manufacturing method of the p-channel transistor 160 is described first with reference to FIGS. 8A to 8H, and then, a manufacturing method of the n-channel transistor 164 is described with reference to FIGS. 9A to 9G and FIGS. 10A to 10D.

Figure 8A:
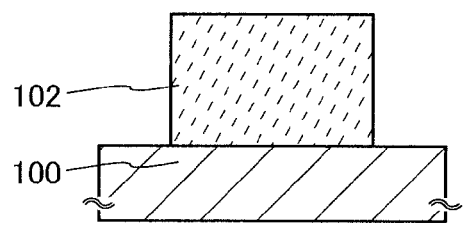
FIGS. 8A to 8H are cross-sectional views illustrating an example of a process of manufacturing a p-channel transistor described in Embodiment 5.
Figure 8E:
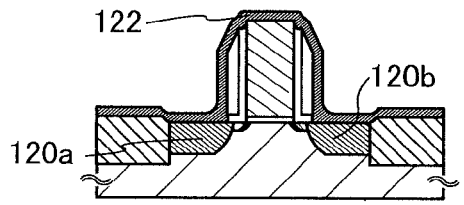

First, the substrate 100 including a semiconductor material is prepared (see FIG. 8A). The substrate 100 including a semiconductor material can be a single crystal semiconductor substrate formed using silicon, silicon carbide, or the like; a polycrystalline semiconductor substrate; a compound semiconductor substrate formed using silicon germanium or the like; an SOI substrate; or the like. Here, an example of the case where a single crystal silicon substrate is used as the substrate 100 including a semiconductor material is described. In general, the term "SOI substrate" means a substrate where a silicon semiconductor layer is provided over an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Further, the "SOI substrate" includes a structure in which a semiconductor layer is formed over an insulating substrate such as a glass substrate with an insulating layer interposed therebetween.

Over the substrate 100, a protective layer 102 serving as a mask for formation of an element isolation insulating layer is formed (see FIG. 8A). As the protective layer 102, for example, an insulating layer formed using silicon oxide, silicon nitride, silicon nitride oxide, or the like can be used. Note that before or after this step, an impurity element imparting n-type conductivity or an impurity element imparting p-type conductivity may be added to the substrate 100 in order to control the threshold voltage of a semiconductor device. In the case where the semiconductor is silicon, the impurity imparting n-type conductivity can be phosphorus, arsenic, or the like. The impurity imparting p-type conductivity can be boron, aluminum, gallium, or the like.

Next, part of the substrate 100 in a region which is not covered with the protective layer 102 (exposed region) is etched with the use of the protective layer 102 as a mask. By this etching, an isolated semiconductor region 104 is formed (see FIG. 8B). As the etching, dry etching is preferably performed, but wet etching can be performed. An etching gas and an etchant can be selected as appropriate depending on a material of layers to be etched.

Figure 8B:
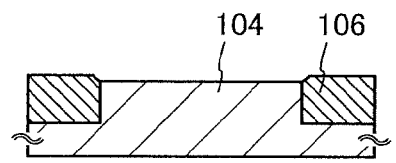
Figure 8F:
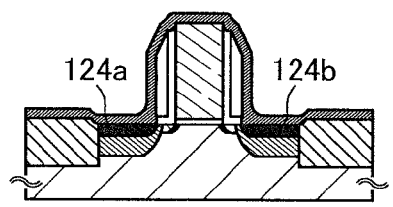

Next, an insulating layer is formed to cover the semiconductor region 104, and the insulating layer in a region overlapping with the semiconductor region 104 is selectively removed, so that the element isolation insulating layers 106 are formed (see FIG. 8B). The insulating layer is formed using silicon oxide, silicon nitride, silicon nitride oxide, or the like. As a removal method of the insulating layer, polishing treatment such as chemical mechanical polishing (CMP), etching treatment, or the like can be given, and any of the above treatment may be used. Note that the protective layer 102 is removed after formation of the semiconductor region 104 or formation of the element isolation insulating layers 106.

Next, an insulating layer is formed over the semiconductor region 104, and a layer including a conductive material is formed over the insulating layer.

The insulating layer serves later as a gate insulating layer, and is formed by a CVD method, a sputtering method, or the like to be a single layer of a silicon oxide film, a silicon nitride oxide film, a silicon nitride film, a hafnium oxide film, an aluminum oxide film, a tantalum oxide film, or the like or a stacked layer including any of the above films. Alternatively, the surface of the semiconductor region 104 is oxidized or nitrided by high-density plasma treatment or thermal oxidation treatment, whereby the insulating layer may be formed. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer. For example, the insulating layer can be formed to have a thickness in the range of larger than or equal to 1 nm and smaller than or equal to 100 nm.

The layer including a conductive material can be formed using a metal material such as aluminum, copper, titanium, tantalum, or tungsten. Alternatively, the layer including a conductive material may be formed using a semiconductor material such as polycrystalline silicon including a conductive material. There is also no particular limitation on the method for forming the layer including a conductive material, and a variety of film formation methods, such as an evaporation method, a CVD method, a sputtering method, or a spin coating method can be employed. Note that the case of forming the layer including a conductive material using a metal material is described in this embodiment.

Figure 8C:
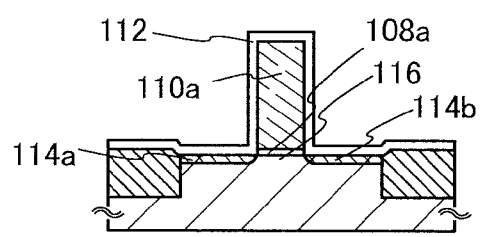

Then, the insulating layer and the layer including a conductive material are selectively etched, so that the gate insulating layer 108a and the gate electrode layer 110a are formed (see FIG. 8C).

Next, an insulating layer 112 covering the gate electrode layer 110a is formed (see FIG. 8C). Then, boron (B), aluminum (Al), or the like is added to the semiconductor region 104, so that the pair of impurity regions 114a and 114b with a shallow junction depth are formed (see FIG. 8C). Note that although boron or aluminum is added here for formation of a p-channel transistor, in the case of forming an n-channel transistor, an impurity element such as phosphorus (P) or arsenic (As) may be added. Note that by formation of the pair of impurity regions 114a and 114b, the channel formation region 116 is formed in the semiconductor region 104 below the gate insulating layer 108a (see FIG. 8C). Here, the concentration of the added impurity can be set as appropriate, and the concentration is preferably set to be high in accordance with high miniaturization of semiconductor elements. Although the pair of impurity regions 114a and 114b are formed after formation of the insulating layer 112 here, the insulating layer 112 may be formed after formation of the pair of impurity regions 114a and 114b.

Figure 8G:
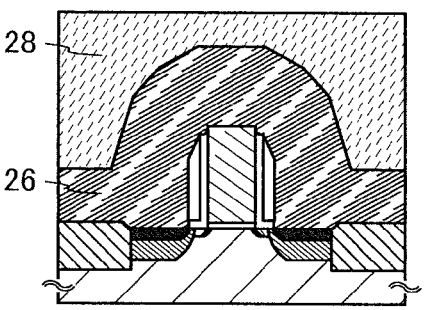
Figure 8D:
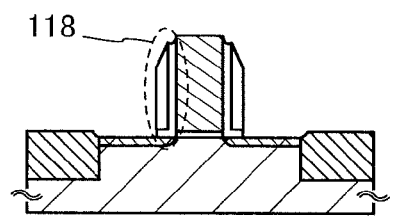

Next, the sidewall insulating layers 118 are formed (see FIG. 8D). An insulating layer is formed so as to cover the insulating layer 112, and highly anisotropic etching treatment is performed on the insulating layer, so that the sidewall insulating layers 118 can be formed in a self-aligned manner. At this time, the insulating layer 112 is partly etched, so that a top surface of the gate electrode layer 110a and top surfaces of the impurity regions 114a and 114b may be exposed.

Next, an insulating layer is formed to cover the gate electrode layer 110a, the pair of impurity regions 114a and 114b, the sidewall insulating layers 118, and the like. Then, boron (B), aluminum (Al), or the like is added to part of the impurity regions 114a and 114b, so that the pair of high concentration impurity regions 120a and 120b are formed (see FIG. 8E). Here, in the case of forming an n-channel transistor, an impurity element such as phosphorus (P) or arsenic (As) may be added. After that, the insulating layer is removed, and a metal layer 122 is formed to cover the gate electrode layer 110a, the sidewall insulating layers 118, the pair of high concentration impurity regions 120a and 120b, and the like (see FIG. 8E). The metal layer 122 can be formed by a variety of film formation methods, such as a vacuum evaporation method, a sputtering method, or a spin coating method. It is preferable that the metal layer 122 be formed using a metal material that reacts with a semiconductor material included in the semiconductor region 104 to be a metal compound having low resistance. Examples of such metal materials include titanium, tantalum, tungsten, nickel, cobalt, and platinum.

Next, heat treatment is performed, so that the metal layer 122 reacts with the semiconductor material. By this heat treatment, the pair of metal compound regions 124a and 124b in contact with the pair of high concentration impurity regions 120a and 120b are formed (see FIG. 8F). In the case where polycrystalline silicon or the like is used for the gate electrode layer 110a, a portion of the gate electrode layer 110a which is in contact with the metal layer 122 also becomes a metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the metal compound region is formed by reaction of the metal material and the semiconductor material, which is a region having sufficiently increased conductivity. The formation of the metal compound regions can properly reduce electric resistance and improve element characteristics. Note that the metal layer 122 is removed after the pair of metal compound regions 124a and 124b are formed.

Next, the interlayer insulating layer 126 and the interlayer insulating layer 128 are formed so as to cover the components formed in the above steps (see FIG. 8G). The interlayer insulating layers 126 and 128 can be formed using a material including an inorganic insulating material, such as silicon oxide, silicon nitride oxide, silicon nitride, hafnium oxide, aluminum oxide, or tantalum oxide. Alternatively, an organic insulating material such as polyimide or acrylic can be used. Although the interlayer insulating layer here has a structure including two layers of the interlayer insulating layer 126 and the interlayer insulating layer 128, the structure of the interlayer insulating layer is not limited thereto. After formation of the interlayer insulating layer 128, a surface of the interlayer insulating layer 128 is preferably planarized by CMP treatment, etching treatment, or the like.

Figure 8H:
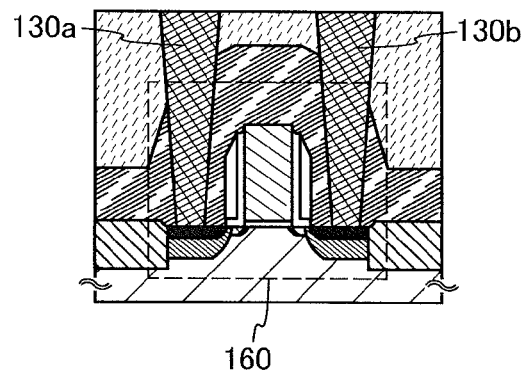

After that, openings reaching the pair of metal compound regions 124a and 124b are formed in the interlayer insulating layers, and the source electrode layer 130a and the drain electrode layer 130b are formed in the openings (see FIG. 8H). A conductive layer is formed by a PVD method, a CVD method, or the like in a region including the openings, and part of the conductive layer is removed by etching treatment or CMP treatment, so that the source electrode layer 130a and the drain electrode layer 130b can be formed.

It is preferable that the source electrode layer 130a and the drain electrode layer 130b be formed to have planar surfaces. For example, after a thin film of a titanium film or a titanium nitride film is formed in the region including the openings, a tungsten film is formed to fill the openings. In that case, unnecessary part of tungsten, titanium, or titanium nitride is removed by CMP treatment, and planarity of the surface can be improved. In such a manner, the surface including the source electrode layer 130a and the drain electrode layer 130b is planarized, whereby an electrode, a wiring, an insulating layer, a semiconductor layer, or the like can be favorably formed in the later step.

Note that here, only the source electrode layer 130a and the drain electrode layer 130b which are in contact with the metal compound regions 124a and 124b are illustrated; however, an electrode layer serving as a wiring (e.g., the electrode layer 130c in FIG. 7) or the like can be formed together in this step. There is no particular limitation on a material for forming the source electrode layer 130a and the drain electrode layer 130b, and a variety of conductive materials can be used. For example, a conductive material such as molybdenum, titanium, chromium, tantalum, tungsten, aluminum, copper, neodymium, or scandium can be used.

Through the above steps, the p-channel transistor 160 using the substrate 100 including a semiconductor material is formed. After the above steps, an electrode, a wiring, an insulating layer, or the like may be further formed. When the wiring has a multilayer wiring structure which is a stacked structure including an interlayer insulating layer and a conductive layer, a highly integrated circuit can be provided. Further, by steps similar to the above steps, an n-channel transistor using the substrate 100 including a semiconductor material can be formed. That is, by using an impurity element such as phosphorus (P) or arsenic (As) as the impurity element added to the semiconductor region in the above step, an n-channel transistor can be formed.

Next, a manufacturing process of the n-channel transistor 164 over the interlayer insulating layer 128 is described with reference to FIGS. 9A to 9G and FIGS. 10A to 10D. Note that FIGS. 9A to 9G and FIGS. 10A to 10D illustrate a manufacturing process of various electrode layers, the n-channel transistor 164, and the like over the interlayer insulating layer 128; accordingly, the p-channel transistor 160 and the like provided below the n-channel transistor 164 are omitted.

First, the insulating layer 132 is formed over the interlayer insulating layer 128, the source electrode layer 130a, the drain electrode layer 130b, and the electrode layer 130c (see FIG. 9A). The insulating layer 132 can be formed by a PVD method, a CVD method, or the like. The insulating layer 132 can be formed using a material including an inorganic insulating material such as silicon oxide, silicon nitride oxide, silicon nitride, hafnium oxide, aluminum oxide, or tantalum oxide.

Next, openings reaching the source electrode layer 130a, the drain electrode layer 130b, and the electrode layer 130c are formed in the insulating layer 132. At this time, an opening is formed also in a region where the gate electrode layer 136d is formed later. Then, a conductive layer 134 is formed so as to fill the openings (see FIG. 9B). The openings can be formed by a method such as etching with the use of a mask or the like. The mask can be formed by a method such as light exposure with the use of a photomask or the like. Either wet etching or dry etching can be used as the etching; in view of microfabrication, dry etching is preferable. The conductive layer 134 can be formed by a film formation method of a PVD method, a CVD method, or the like. A material used for formation of the conductive layer 134 can be a conductive material such as molybdenum, titanium, chromium, tantalum, tungsten, aluminum, copper, neodymium, or scandium, an alloy thereof, a compound such as nitride including the above material, or the like.

More specifically, a method can be employed as an example, in which a thin film of titanium is formed by a PVD method in a region including the openings, a thin film of titanium nitride is formed by a CVD method, and a tungsten film is formed to fill the openings. Here, the titanium film formed by a PVD method has a function to deoxidize an oxide film at an interface so as to reduce contact resistance with the lower electrode layers (here, the source electrode layer 130a, the drain electrode layer 130b, the electrode layer 130c, and the like). The titanium nitride film formed after that has a barrier function to suppress diffusion of a conductive material. Further, after the barrier film of titanium, titanium nitride, or the like is formed, a copper film may be formed by a plating method.

After the conductive layer 134 is formed, part of the conductive layer 134 is removed by etching treatment, CMP treatment, or the like, so that the insulating layer 132 is exposed; accordingly, the electrode layer 136a, the electrode layer 136b, the electrode layer 136c, and the gate electrode layer 136d are formed (see FIG. 9C). Note that when the electrode layer 136a, the electrode layer 136b, the electrode layer 136c, and the gate electrode layer 136d are formed by removing part of the conductive layer 134, it is preferable that a planar surface be formed. By planarizing the surfaces of the insulating layer 132, the electrode layer 136a, the electrode layer 136b, the electrode layer 136c, and the gate electrode layer 136d, an electrode, a wiring, an insulating layer, a semiconductor layer, or the like can be favorably formed in the later step.

Next, the gate insulating layer 138 is formed to cover the insulating layer 132, the electrode layer 136a, the electrode layer 136b, the electrode layer 136c, and the gate electrode layer 136d (see FIG. 9D). The gate insulating layer 138 can be formed by a CVD method, a sputtering method, or the like. Further, the gate insulating layer 138 is preferably formed to include silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 can be formed using silicon oxynitride by a plasma CVD method in which silane (SiH$_4$), oxygen, and nitride are used as a source gas. There is no particular limitation on the thickness of the gate insulating layer 138. For example, the gate insulating layer 138 can be formed to have a thickness in the range of larger than or equal to 10 nm and smaller than or equal to 500 nm. In the case of a stacked-layer structure, a preferable structure includes a first gate insulating layer with a thickness of larger than or equal to 50 nm and smaller than or equal to 200 nm and a second gate insulating layer with a thickness of larger than or equal to 5 nm and smaller than or equal to 300 nm thereover.

An i-type or substantially i-type oxide semiconductor achieved by removal of impurities (a highly purified oxide semiconductor) is extremely sensitive to interface state density or interface charge. Therefore, an interface between an oxide semiconductor layer and a gate insulating layer is an important factor in the case where such an oxide semiconductor is used for the oxide semiconductor layer. In other words, the gate insulating layer 138 which is in contact with the highly purified oxide semiconductor layer needs to have high quality.

For example, high-density plasma CVD method using μ waves (2.45 GHz) is preferable in that it produces a dense and high-quality gate insulating layer 138 with high withstand voltage. This is because a close contact between a highly purified oxide semiconductor layer and a high-quality gate insulating layer reduces interface state density and produces desirable interface characteristics.

Needless to say, even when a highly purified oxide semiconductor layer is used, another method such as a sputtering method or a plasma CVD method can be used as long as a high-quality insulating layer can be formed as a gate insulating layer. An insulating layer whose film quality or interface characteristic is modified by heat treatment after film formation may be employed. In any case, an insulating layer that has favorable film quality as the gate insulating layer 138 and can reduce interface level density with an oxide semiconductor layer to form a favorable interface may be formed as the gate insulating layer 138.

In a gate bias-temperature test (BT test) at 85° C. for 12 hours with $2 \times 10^6$ V/cm, if an impurity is added to an oxide semiconductor, a bond between the impurity and the main component of the oxide semiconductor is cut by a strong electric field (B: bias) and a high temperature (T: temperature), and a generated dangling bond induces a shift in the threshold voltage (Vth).

On the other hand, when an impurity in an oxide semiconductor, especially hydrogen, water, or the like, is removed as much as possible so that an interface with the gate insulating layer can have favorable characteristics, a transistor which is stable to the BT test can be obtained.

Next, an oxide semiconductor layer is formed over the gate insulating layer 138 and processed by a method such as etching using a mask, whereby the island-shaped oxide semiconductor layer 140 is formed (see FIG. 9E).

As the oxide semiconductor layer, an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer is used. In particular, an amorphous oxide semiconductor layer is preferable. In this embodiment, an amorphous oxide semiconductor layer is formed as the oxide semiconductor layer by a sputtering method with the use of an In—Ga—Zn—O-based metal oxide target. The addition of silicon to an amorphous oxide semiconductor layer suppress the crystallization of the layer; therefore, the oxide semiconductor layer may be formed using a target containing $SiO_2$ at 2 wt % to 10 wt % inclusive.

As a target for forming the oxide semiconductor layer by a sputtering method, a metal oxide target containing zinc oxide as a main component can be used, for example. Alternatively, a metal oxide target containing In, Ga, and Zn (a composition ratio is $In_2O_3:Ga_2O_3:ZnO=1:1:1$ [molar ratio], In:Ga:Zn=1:1:0.5 [atomic ratio]) can be used. As the metal oxide target containing In, Ga, and Zn, a target having a composition ratio of In:Ga:Zn=1:1:1 [atomic ratio] or a target having a composition ratio of In:Ga:Zn=1:1:2 [atomic ratio] can also be used. The filling factor of the metal oxide target is from 90% to 100% inclusive, and preferably 95% or higher (e.g., 99.9%). With the use of metal oxide target with high filling factor, an oxide semiconductor layer which is a dense film can be formed.

A preferable atmosphere for formation of the oxide semiconductor layer is a rare gas (typically argon) atmosphere, an oxygen atmosphere, or a mixed atmosphere of a rare gas (typically argon) and oxygen. Specifically, a high-purity gas is preferably used, in which an impurity such as hydrogen, water, a hydroxyl group, or a hydride is reduced to approximately several parts per million (ppm) (preferably approximately several parts per billion (ppb)).

In formation of the oxide semiconductor layer, the substrate is set in a treatment chamber at reduced pressure and the substrate temperature is set at 100° C. to 600° C. inclusive, preferably 200° C. to 400° C. inclusive. Depositing while heating the substrate can reduce the impurity concentration in the oxide semiconductor layer. In addition, damage by sputtering can be reduced. Then, a sputtering gas from which hydrogen and moisture are removed is introduced into the treatment chamber from which remaining moisture is being removed, and an oxide semiconductor layer is formed with the use of a metal oxide as a target. In order to remove residual moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$) (preferably, also a compound containing a carbon atom), and the like are removed, whereby the impurity concentration in the oxide semiconductor layer formed in the treatment chamber can be reduced.

As an example of a deposition condition, the distance between the substrate and the target is 100 mm, the pressure is 0.6 Pa, the direct current (DC) power is 0.5 kW, and an atmosphere of deposition is an oxygen atmosphere (the proportion of oxygen flow is 100%). Note that a pulsed direct current (DC) power supply is preferably used because powder substances (also referred to as particles or dust) generated in film deposition can be reduced and the film thickness can be uniform. The thickness of the oxide semiconductor layer is 2 nm to 200 nm inclusive, preferably 5 nm to 30 nm inclusive. Note that an appropriate thickness differs depending on an oxide semiconductor material, and the thickness may be set as appropriate depending on the material.

Note that before the oxide semiconductor layer is formed by a sputtering method, dust on a surface of the gate insulating layer 138 is preferably removed by reverse sputtering in which an argon gas is introduced and plasma is generated. The reverse sputtering refers to a method in which instead of making ions collide to a sputtering target in general spurting, ions are made to collide to a surface to be treated so that the surface is modified. A method for making ions collide to a surface to be treated includes a method in which high frequency voltage is applied on the surface side in an argon atmosphere and plasma is generated in the vicinity of the substrate. Note that a nitrogen atmosphere, a helium atmosphere, an oxygen atmosphere, or the like may be used instead of an argon atmosphere.

The etching of the oxide semiconductor layer can be either dry etching or wet etching. Needless to say, both dry etching and wet etching can be combined and used. Etching conditions (such as an etching gas, an etchant, etching time, and temperature) are adjusted as appropriate in accordance with the material, so that the oxide semiconductor layer can be processed into the desired shape.

For example, a gas containing chlorine (a chlorine-based gas such as chlorine ($Cl_2$), boron chloride ($BCl_3$), silicon tetrachloride ($SiCl_4$), or carbon tetrachloride ($CCl_4$)) can be employed as an etching gas used for the dry etching. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layer into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, an etchant such as ITO07N (produced by KANTO CHEMICAL CO., INC.) may be used.

Next, first heat treatment is preferably performed on the oxide semiconductor layer. By the first heat treatment, the oxide semiconductor layer can be dehydrated or dehydrogenated. The temperature of the first heat treatment is higher than or equal to 300° C. and lower than or equal to 750° C., preferably higher than or equal to 400° C. and lower than a strain point of the substrate. For example, the substrate is introduced into an electric furnace using a resistance heating element or the like, and the oxide semiconductor layer 140 is subjected to heat treatment at 450° C. for one hour in a nitrogen atmosphere. During the heat treatment, the oxide semiconductor layer 140 is not exposed to air to prevent entry of water and hydrogen.

Note that a heat treatment apparatus is not limited to an electrical furnace, and may be an apparatus which heats an object to be processed with heat conduction or heat radiation given by a medium such as a heated gas or the like. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and transferred and taken out from the heated inert gas. With GRTA, high-temperature heat treatment for a short time can be achieved. Further, GRTA is heat treatment for a short time; therefore, it can be employed even under a temperature condition which is higher than a strain point of the substrate.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the impurity concentration is less than or equal to 1 ppm, preferably less than or equal to 0.1 ppm).

Depending on conditions of the first heat treatment or the material of the oxide semiconductor layer, the oxide semiconductor layer is crystallized to be microcrystalline or polycrystalline in some cases. For example, the oxide semiconductor layer may crystallize to become microcrystalline semiconductor layer having a degree of crystallization of 90% or more, or 80% or more. Further, depending on the conditions of the first heat treatment and the material of the oxide semiconductor layer, the oxide semiconductor layer becomes an amorphous oxide semiconductor layer containing no crystalline component in other cases.

The oxide semiconductor layer might become an oxide semiconductor layer in which a microcrystalline portion (with a grain diameter greater than or equal to 1 nm and less than or equal to 20 nm, typically greater than or equal to 2 nm and less than or equal to 4 nm) exits in an amorphous oxide semiconductor (for example, a surface of the oxide semiconductor layer).

Further, the electric characteristics of the oxide semiconductor layer can be changed by aligning microcrystals in the amorphous oxide semiconductor. For example, in the case where the oxide semiconductor layer is formed using an In—Ga—Zn—O-based metal oxide target, a microcrystalline portion where crystal grains of $In_2Ga_2ZnO_7$ having electrical anisotropy are aligned is formed, whereby the electric characteristics of the oxide semiconductor layer can be changed.

More specifically, by aligning crystal grains of $In_2Ga_2ZnO_7$ whose c-axis is in the direction perpendicular to a surface of the oxide semiconductor layer, conductivity in the direction parallel to the surface of the oxide semiconductor layer can be increased, and an insulating property in the direction perpendicular to the surface of the oxide semiconductor layer can be increased. Further, such a microcrystalline portion has a function of preventing an impurity such as water or hydrogen from entering the oxide semiconductor layer.

Note that the oxide semiconductor layer including the above-described microcrystalline portion can be obtained by heating a surface of the oxide semiconductor layer by GRTA. The use of a sputtering target that contains more In or Ga than Zn enables a much preferable oxide semiconductor layer to be formed.

The first heat treatment may be performed on the oxide semiconductor layer which has not been processed into the island-shaped oxide semiconductor layer 140. In that case, after the first heat treatment, the substrate is taken out of the heating apparatus and a photolithography step is performed.

Note that the first heat treatment can also be called dehydration treatment or dehydrogenation treatment because it is effective in dehydrating or dehydrogenating the oxide semiconductor layer 140. It is possible to perform such dehydration treatment or dehydrogenation treatment after forming the oxide semiconductor layer, after stacking source and drain electrode layers over the oxide semiconductor layer 140, or after forming a protective insulating layer over the source and drain electrode layers. Such dehydration treatment or dehydrogenation treatment may be conducted more than once.

Next, the source electrode layer 142*a* and the drain electrode layer 142*b* are formed so as to be in contact with the oxide semiconductor layer 140 (see FIG. 9F). A conductive layer is formed to cover the oxide semiconductor layer 140 and then partly etched, so that the source electrode layer 142*a* and the drain electrode layer 142*b* can be formed.

The conductive layer can be formed by a CVD method such as a plasma CVD method or a PVD method including a sputtering method. Examples of the material for the conductive layer include an element selected from aluminum, chromium, copper, tantalum, titanium, molybdenum, and tungsten, and an alloy including any of these elements as a component. Alternatively, one or more of materials selected from manganese, magnesium, zirconium, beryllium, and thorium may be used. Further alternatively, aluminum combined with one or more of elements selected from titanium, tantalum, tungsten, molybdenum, chromium, neodymium, and scandium may be used as the material. The conductive layer may have either a single-layer structure or a staked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

Here, ultraviolet rays, a KrF laser beam, or an ArF laser beam is preferably used for light exposure for making an etching mask.

The channel length (L) of the transistor is determined by a distance between a lower edge portion of the source electrode layer 142a and a lower edge portion of the drain electrode layer 142b. In the case where the channel length (L) is shorter than 25 nm, light exposure for making a mask is performed with the use of extreme ultraviolet rays with extremely short wavelength of several nanometers to several tens of nanometers. Light exposure with extreme ultraviolet rays yields high resolution and a great depth of focus. Therefore, the channel length (L) of a transistor, which is formed later, can be from 10 nm to 1000 nm inclusive, and thus the operation rate of the circuit can be increased.

The materials for the conductive layer and the oxide semiconductor layer 140 and etching conditions are adjusted as appropriate so that the oxide semiconductor layer 140 is not removed in etching of the conductive layer. In this step, the oxide semiconductor layer 140 is partly etched to be an oxide semiconductor layer having a groove (a depressed portion) depending on the materials and the etching conditions.

An oxide conductive layer may be formed between the oxide semiconductor layer 140 and the source electrode layer 142a or between the oxide semiconductor layer 140 and the drain electrode layer 142b. It is possible to successively form the oxide conductive layer and a metal layer which is to be the source electrode layer 142a and the drain electrode layer 142b (successive formation). The oxide conductive layer can function as a source region or a drain region. Such an oxide conductive layer leads to reduction in the resistance of the source region or a drain region, and thus high-speed operation of the transistor is achieved.

In order to reduce the number of the masks used or the number of steps, a resist mask is formed with the use of a multi-tone mask which is a light-exposure mask through which light is transmitted to have a plurality of intensities, and etching may be performed with the use of the resist mask. Since a resist mask formed using a multi-tone mask has a plurality of thicknesses (step-like shape) and can be further changed in shape by performing ashing, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can also be reduced, whereby simplification of steps can be realized.

Note that plasma treatment using a gas such as $N_2O$, $N_2$, or Ar is preferably conducted after the above process. The plasma treatment removes water or the like that adheres to an exposed surface of the oxide semiconductor layer. In the plasma treatment, a mixed gas of oxygen and argon may be used.

Next, the protective insulating layer 144 which is in contact with part of the oxide semiconductor layer 140 is formed without being exposed to air (see FIG. 9G).

The protective insulating layer 144 can be formed using as appropriate a method, such as a sputtering method, by which an impurity such as water or hydrogen is prevented from entering the protective insulating layer 144. The thickness of the protective insulating layer 144 is at least 1 nm or larger. Examples of the material for the protective insulating layer 144 include silicon oxide, silicon nitride, silicon oxynitride, and silicon nitride oxide. A structure can be either a single-layer structure or a stacked-layer structure. The substrate temperature for the deposition of the protective insulating layer 144 is preferably higher than or equal to room temperature and lower than or equal to 300° C. The atmosphere for the deposition is preferably a rare gas (typically argon) atmosphere, an oxygen atmosphere, or a mixed atmosphere of a rare gas (typically argon) and oxygen.

When hydrogen is contained in the protective insulating layer 144, entry of the hydrogen to the oxide semiconductor layer 140 or extraction of oxygen in the oxide semiconductor layer 140 by the hydrogen is caused, thereby making the resistance on the back channel side of the oxide semiconductor layer 140 low, so that a parasitic channel might be formed. Therefore, it is important that a film formation method in which hydrogen is not used be employed in order to form the protective insulating layer 144 containing as little hydrogen as possible.

It is preferable to form the protective insulating layer 144 while moisture remaining in the treatment chamber is removed, in order to prevent hydrogen, a hydroxyl group, or moisture from entering the oxide semiconductor layer 140 and the protective insulating layer 144.

In order to remove residual moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$), and the like are removed, whereby the impurity concentration in the protective insulating layer 144 formed in the treatment chamber can be reduced.

A sputtering gas used for the deposition of the protective insulating layer 144 is preferably a high-purity gas in which the concentration of an impurity such as hydrogen, water, a hydroxyl group, or a hydride is reduced to approximately several parts per million (ppm) (preferably approximately several parts per billion (ppb)).

Next, second heat treatment is preferably performed in an inert gas atmosphere or oxygen gas atmosphere (preferably at 200° C. to 400° C. inclusive, e.g. 250° C. to 350° C. inclusive). For example, the second heat treatment is performed in a nitrogen atmosphere at 250° C. for one hour. The second heat treatment can reduce variation in electric characteristics of the transistor.

Further, heat treatment may be performed at 100° C. to 200° C. inclusive for 1 hour to 30 hours in air. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the protective insulating layer. Under the reduced pressure, the heating time can be shortened. Note that this heat treatment may be performed instead of the second heat treatment, or performed before the second heat treatment, after the second heat treatment, or the like.

Figure 10A:
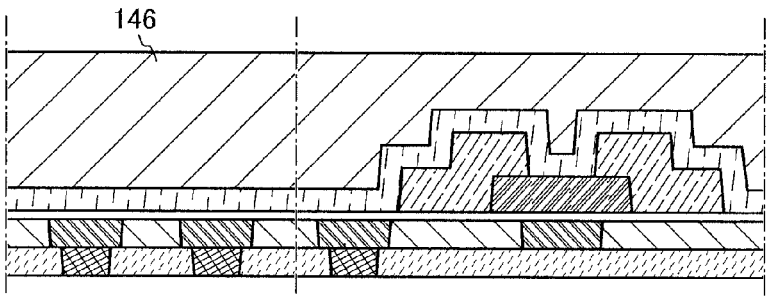
FIGS. 10A to 10D are cross-sectional views illustrating an example of a process of manufacturing an n-channel transistor described in Embodiment 5.
Figure 10B:
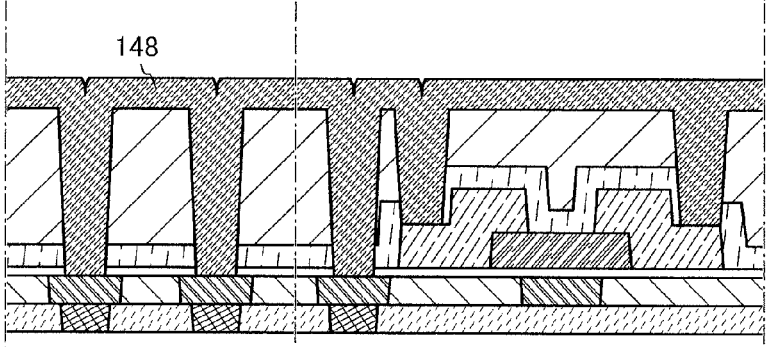

Next, the interlayer insulating layer 146 is formed over the protective insulating layer 144 (see FIG. 10A). The interlayer insulating layer 146 can be formed by a PVD method, a CVD method, or the like. The interlayer insulating layer 146 can be formed using a material including an inorganic insulating material, such as silicon oxide, silicon nitride oxide, silicon nitride, hafnium oxide, aluminum oxide, or tantalum oxide. After formation of the interlayer insulating layer 146, it is preferable that a surface of the interlayer insulating layer 146 be planarized by CMP, etching, or the like.

Next, openings reaching the electrode layer 136*a*, the electrode layer 136*b*, the electrode layer 136*c*, the source electrode layer 142*a*, and the drain electrode layer 142*b* are formed in the interlayer insulating layer 146, the protective insulating layer 144, and the gate insulating layer 138. Then, a conductive layer 148 is formed so as to fill the openings (see FIG. 10B). The openings can be formed by etching using a mask. The mask can be made by light exposure with the use of a photomask, for example. Either wet etching or dry etching can be used as the etching; in view of microfabrication, dry etching is preferably used. The conductive layer 148 can be formed by a deposition method such as a PVD method or a CVD method. Examples of the material for the conductive layer 148 include a conductive material such as molybdenum, titanium, chromium, tantalum, tungsten, aluminum, copper, neodymium, and scandium, and an alloy and compound (e.g., a nitride) of any of these materials.

Specifically, a method can be employed as an example, in which a thin film of titanium is formed by a PVD method in a region including the openings; a thin film of titanium nitride is formed by a CVD method, and a tungsten film is formed to fill the openings. Here, the titanium film formed by a PVD method has a function to deoxidize an oxide film at an interface so as to reduce contact resistance with the lower electrode layers (here, the electrode layer 136*a*, the electrode layer 136*b*, the electrode layer 136*c*, the source electrode layer 142*a*, and the drain electrode layer 142*b*). The titanium nitride film formed after that has a barrier function to suppress diffusion of a conductive material. Further, after the barrier film of titanium, titanium nitride, or the like is formed, a copper film may be formed by a plating method.

Figure 10C:
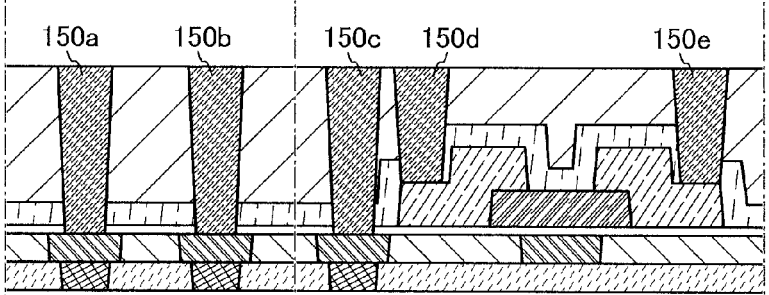

After the conductive layer 148 is formed, part of the conductive layer 148 is removed by etching, CMP, or the like, so that the interlayer insulating layer 146 is exposed and the electrode layer 150*a*, the electrode layer 150*b*, the electrode layer 150*c*, the electrode layer 150*d*, and the electrode layer 150*e* are formed (see FIG. 10C). Note that when the electrode layer 150*a*, the electrode layer 150*b*, the electrode layer 150*c*, the electrode layer 150*d*, and the electrode layer 150*e* are formed by removing part of the conductive layer 148, it is preferable that a planar surface be formed. By planarizing the surfaces of the interlayer insulating layer 146, the electrode layer 150*a*, the electrode layer 150*b*, the electrode layer 150*c*, the electrode layer 150*d*, and the electrode layer 150*e*, an electrode, a wiring, an insulating layer, a semiconductor layer, or the like can be favorably formed in the later step.

Further, the insulating layer 152 is formed, and openings reaching the electrode layer 150*a*, the electrode layer 150*b*, the electrode layer 150*c*, the electrode layer 150*d*, and the electrode layer 150*e* are formed in the insulating layer 152. Then, a conductive layer is formed so as to fill the openings.

Figure 10D:
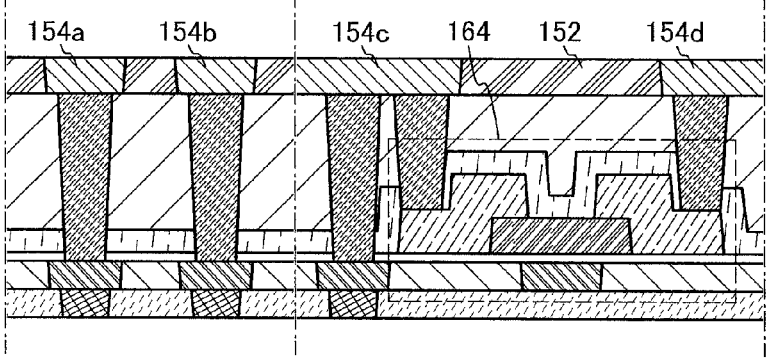

After that, part of the conductive layer is removed by etching, CMP, or the like, so that the insulating layer 152 is exposed and the electrode layer 154*a*, the electrode layer 154*b*, the electrode layer 154*c*, and the electrode layer 154*d* are formed (see FIG. 10D). This step is similar to the step of forming the electrode layer 150*a* and the like; thus, detailed description is omitted.

When the n-channel transistor 164 is manufactured in the above manner, the hydrogen concentration of the oxide semiconductor layer 140 is lower than $5 \times 10^{19}$ (atoms/cm$^3$), and the leakage current of the n-channel transistor 164 can be reduced. Such an n-channel transistor 164 having excellent characteristics is used in the semiconductor devices described in Embodiments 1 to 4, whereby standby power of the semiconductor devices can be reduced.

Modification Example

FIG. 11, FIGS. 12A and 12B, FIGS. 13A and 13B, and FIGS. 14A and 14B illustrate modification examples of structures of the n-channel transistor 164. That is, the structure of the p-channel transistor 160 is the same as the above.

Figure 11:
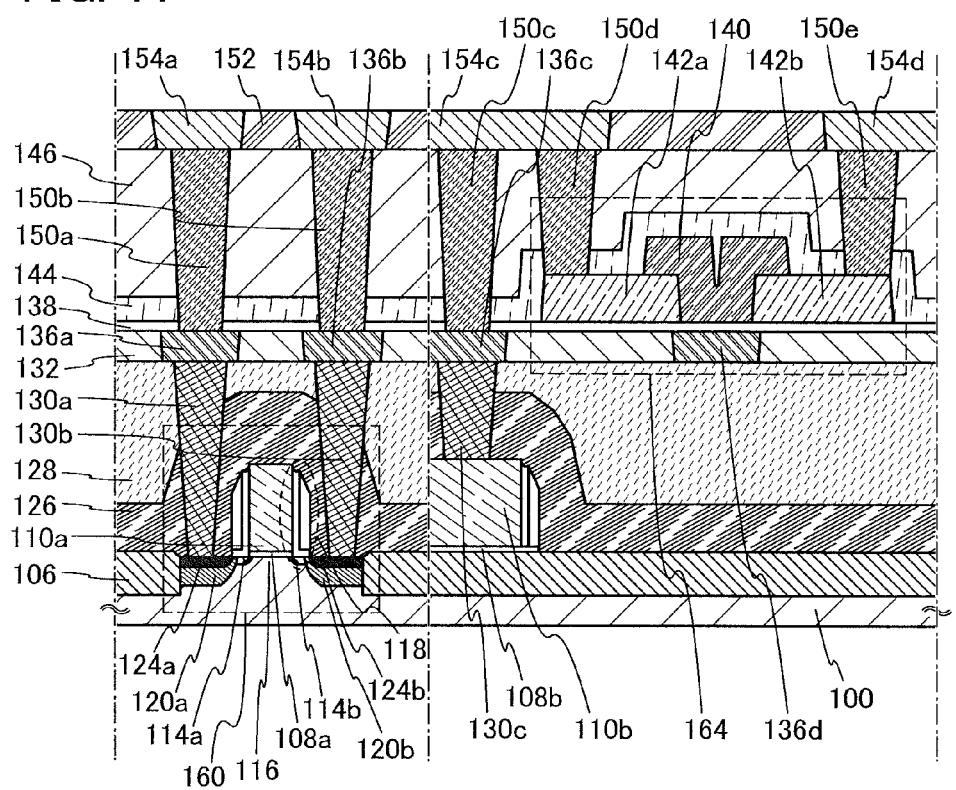
FIG. 11 is a cross-sectional view illustrating a structure example of a p-channel transistor and an n-channel transistor described in Embodiment 5.

FIG. 11 illustrates an example of an n-channel transistor 164 having a structure in which the gate electrode layer 136*d* is placed below the oxide semiconductor layer 140 and the source electrode layer 142*a* and the drain electrode layer 142*b* are in contact with a bottom surface of the oxide semiconductor layer 140.

A big difference between the structure in FIG. 11 and the structure in FIG. 7 is the position at which the oxide semiconductor layer 140 is connected to the source and drain electrode layers 142*a* and 142*b*. That is, a top surface of the oxide semiconductor layer 140 is in contact with the source and drain electrode layers 142*a* and 142*b* in the structure in FIG. 7, whereas the bottom surface of the oxide semiconductor layer 140 is in contact with the source and drain electrode layers 142*a* and 142*b* in the structure in FIG. 11. Moreover, the difference in the contact position results in a different arrangement of other electrode layers, insulating layers, and the like. The details of each component are the same as those in FIG. 7.

Specifically, the n-channel transistor 164 illustrated in FIG. 11 includes the gate electrode layer 136*d* provided over the interlayer insulating layer 128, the gate insulating layer 138 provided over the gate electrode layer 136*d*, the source and drain electrode layers 142*a* and 142*b* provided over the gate insulating layer 138, and the oxide semiconductor layer 140 in contact with top surfaces of the source and drain electrode layers 142*a* and 142*b*. In addition, over the n-channel transistor 164, the protective insulating layer 144 is provided so as to cover the oxide semiconductor layer 140.

Figure 12A:
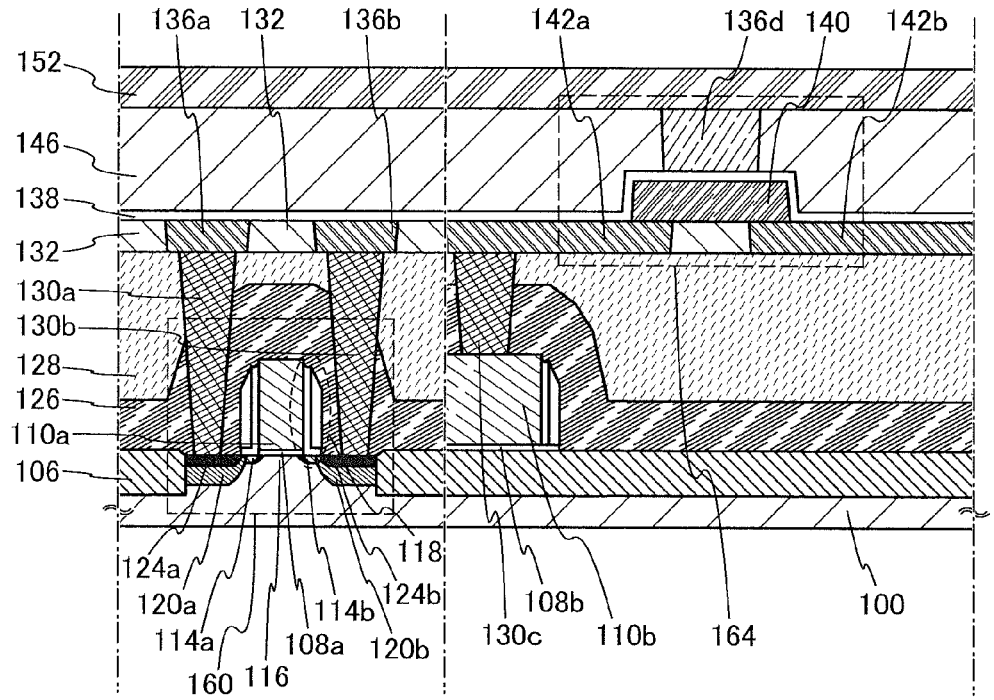
FIGS. 12A and 12B are each a cross-sectional view illustrating a structure example of a p-channel transistor and an n-channel transistor described in Embodiment 5.
Figure 12B:
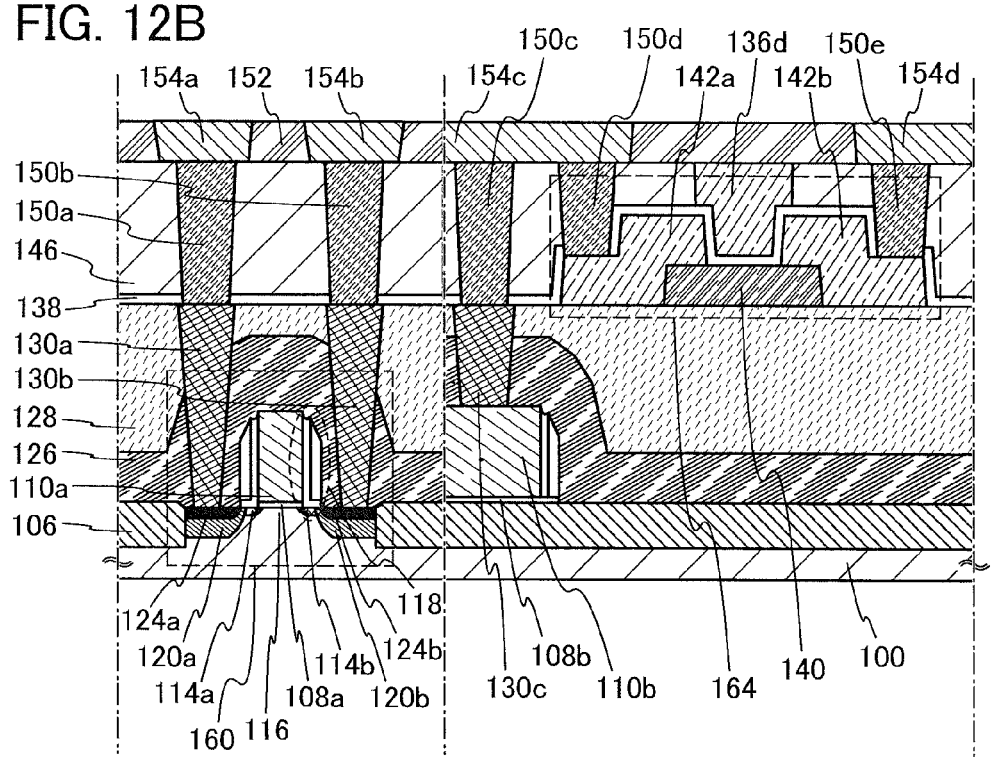

FIGS. 12A and 12B each illustrate an n-channel transistor 164 in which the gate electrode layer 136*d* is provided over the oxide semiconductor layer 140. FIG. 12A illustrates an example of a structure in which the source and drain electrode layers 142*a* and 142*b* are in contact with a bottom surface of the oxide semiconductor layer 140. FIG. 12B illustrates an example of a structure in which the source and drain electrode layers 142*a* and 142*b* are in contact with a top surface of the oxide semiconductor layer 140.

A big difference of the structures in FIGS. 12A and 12B from those in FIG. 7 and FIG. 11 is that the gate electrode layer 136*d* is placed over the oxide semiconductor layer 140. Furthermore, a big difference between the structure in FIG. 12A and the structure in FIG. 12B is that the source and drain electrode layers 142*a* and 142*b* are in contact with either the bottom surface or the top surface of the oxide semiconductor layer 140. Moreover, these differences result in a different arrangement of other electrode layers, insulating layers, and the like. The details of each component are the same as those in FIG. 7, and the like.

Specifically, the n-channel transistor 164 illustrated in FIG. 12A includes the source and drain electrode layers 142a and 142b provided over the interlayer insulating layer 128, the oxide semiconductor layer 140 in contact with top surfaces of the source and drain electrode layers 142a and 142b, the gate insulating layer 138 provided over the oxide semiconductor layer 140, and the gate electrode layer 136d over the gate insulating layer 138 in a region overlapping with the oxide semiconductor layer 140.

The n-channel transistor 164 illustrated in FIG. 12B includes the oxide semiconductor layer 140 provided over the interlayer insulating layer 128, the source and drain electrode layers 142a and 142b provided to be in contact with a top surface of the oxide semiconductor layer 140, the gate insulating layer 138 provided over the oxide semiconductor layer 140 and the source and drain electrode layers 142a and 142b, and the gate electrode layer 136d provided over the gate insulating layer 138 in a region overlapping with the oxide semiconductor layer 140.

Note that in the structures in FIGS. 12A and 12B, a component (e.g., the electrode layer 150a or the electrode layer 154a) is sometimes omitted from the structure in FIG. 7 or the like. In this case, a secondary effect such as simplification of a manufacturing process can be obtained. It is needless to say that a nonessential component can also be omitted in the structures in FIG. 7 and the like.

Figure 13A:
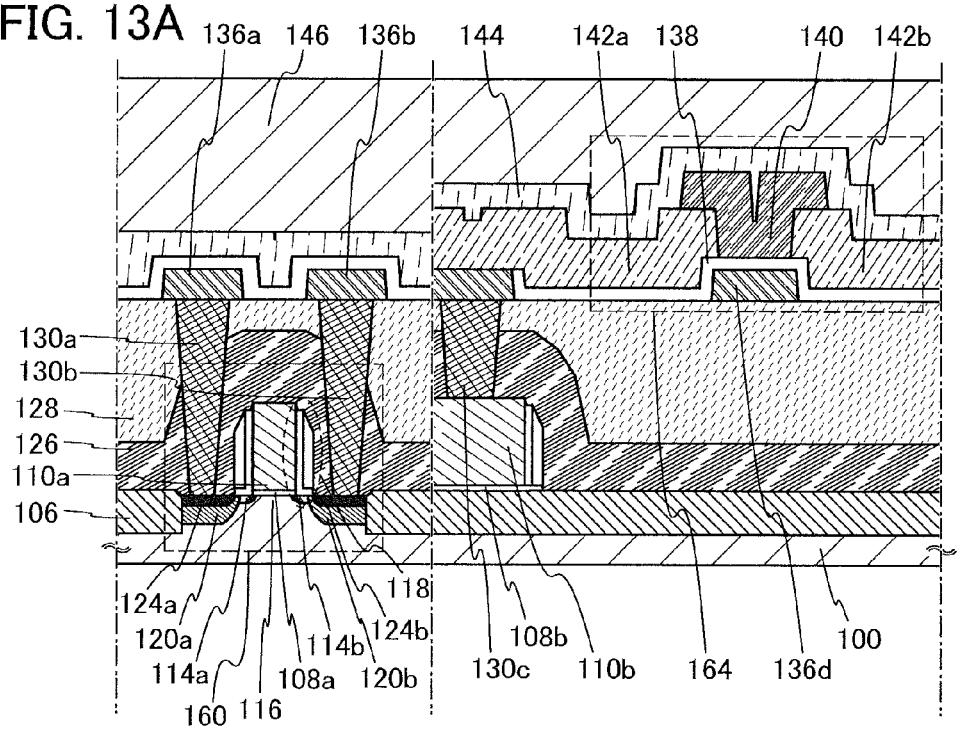
FIGS. 13A and 13B are each a cross-sectional view illustrating a structure example of a p-channel transistor and an n-channel transistor described in Embodiment 5.
Figure 13B:
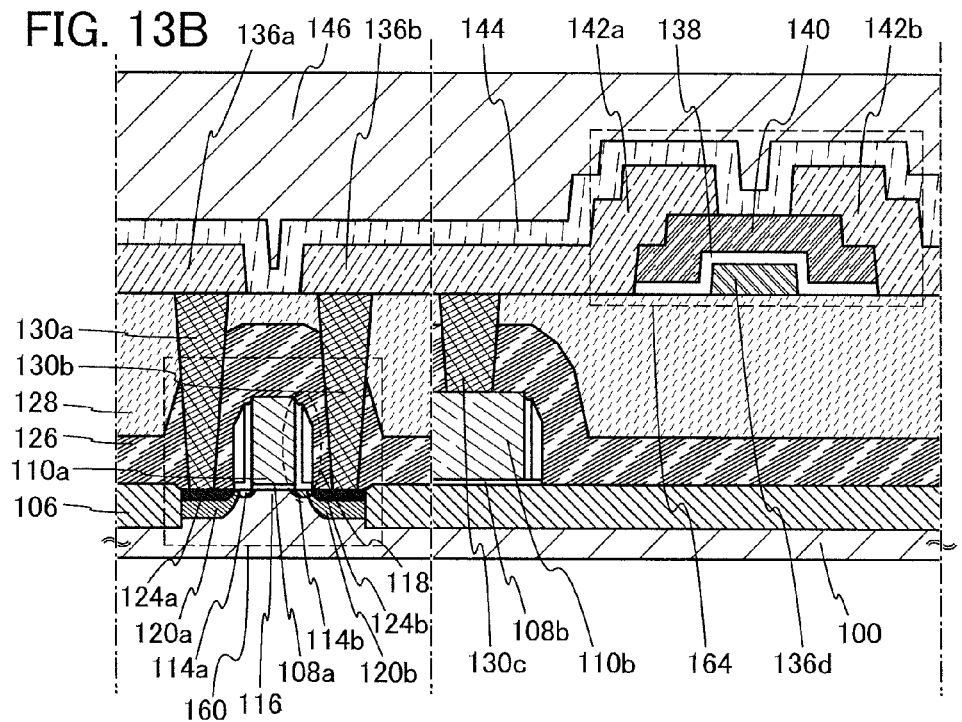

FIGS. 13A and 13B each illustrate an n-channel transistor 164 in the case where the size of the element is relatively large and the gate electrode layer 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode layer 136d and the like can be formed by patterning after formation of a conductive layer.

A big difference between the structure in FIG. 13A and the structure in FIG. 13B is that the source and drain electrode layers 142a and 142b are in contact with either the bottom surface or the top surface of the oxide semiconductor layer 140. Moreover, these differences result in a different arrangement of other electrode layers, insulating layers, and the like. The details of each component are the same as those in FIG. 7, and the like.

Specifically, the n-channel transistor 164 illustrated in FIG. 13A includes the gate electrode layer 136d provided over the interlayer insulating layer 128, the gate insulating layer 138 provided over the gate electrode layer 136d, the source and drain electrode layers 142a and 142b provided over the gate insulating layer 138, and the oxide semiconductor layer 140 in contact with top surfaces of the source and drain electrode layers 142a and 142b.

Further, the n-channel transistor 164 illustrated in FIG. 13B includes the gate electrode layer 136d provided over the interlayer insulating layer 128, the gate insulating layer 138 provided over the gate electrode layer 136d, the oxide semiconductor layer 140 provided over the gate insulating layer 138 so as to overlap with the gate electrode layer 136d, and the source and drain electrode layers 142a and 142b provided to be in contact with a top surface of the oxide semiconductor layer 140.

Note that also in the structures in FIGS. 13A and 13B, a component is sometimes omitted from the structure in FIG. 7 or the like. Also in this case, a secondary effect such as simplification of a manufacturing process can be obtained.

Figure 14A:
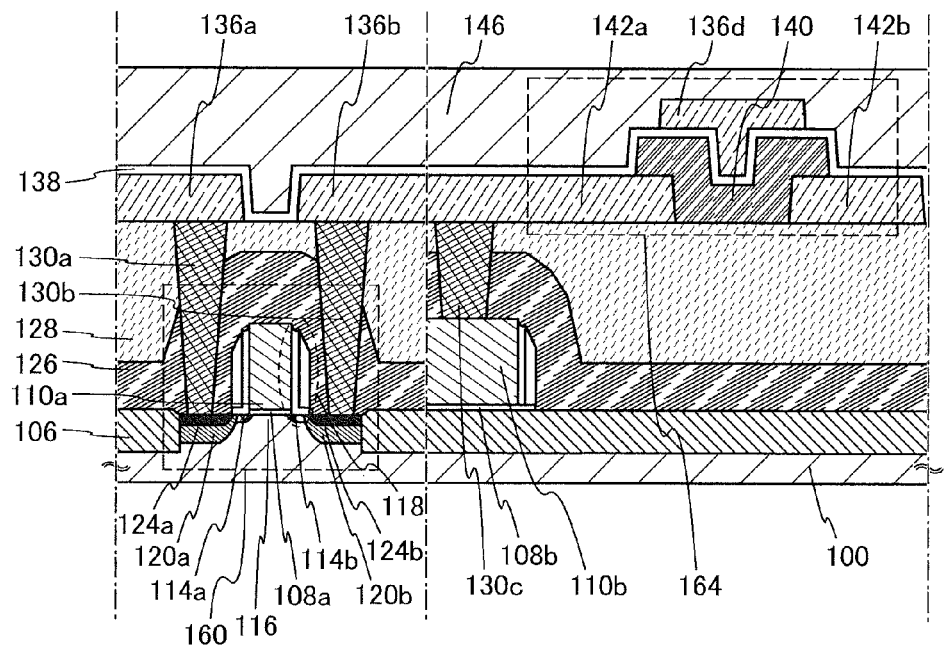
FIGS. 14A and 14B are each a cross-sectional view illustrating a structure example of a p-channel transistor and an n-channel transistor described in Embodiment 5.
Figure 14B:
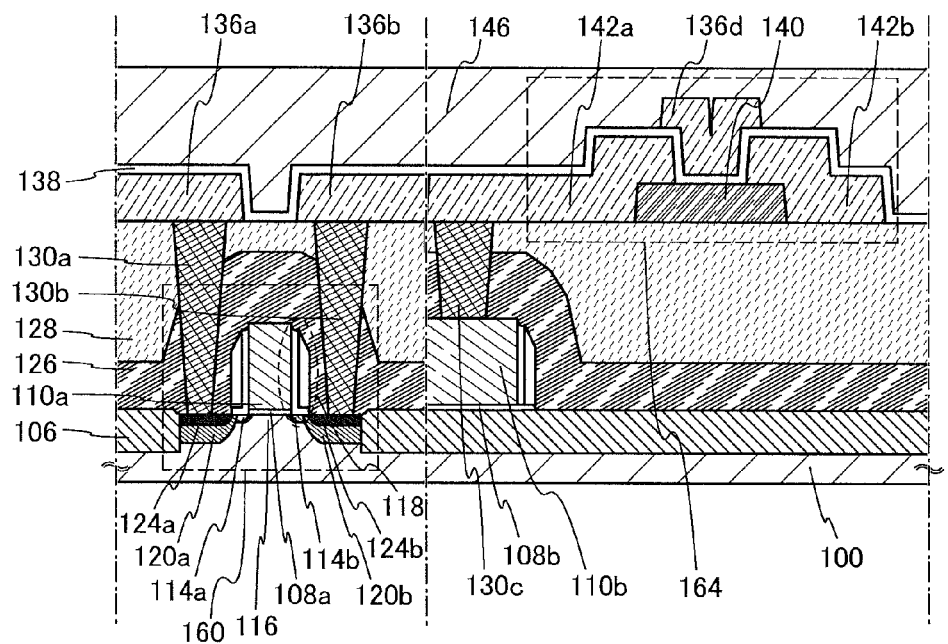

FIGS. 14A and 14B each illustrate an n-channel transistor 164 in the case where the size of the element is relatively large and the gate electrode layer 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode layer 136d and the like can be formed by patterning after formation of a conductive layer.

A big difference between the structure in FIG. 14A and the structure in FIG. 14B is that the source and drain electrode layers 142a and 142b are in contact with either the bottom surface or the top surface of the oxide semiconductor layer 140. Moreover, these differences result in a different arrangement of other electrode layers, insulating layers, and the like. The details of each component are the same as those in FIG. 7, and the like.

Specifically, the n-channel transistor 164 illustrated in FIG. 14A includes the source and drain electrode layers 142a and 142b provided over the interlayer insulating layer 128, the oxide semiconductor layer 140 in contact with top surfaces of the source and drain electrode layers 142a and 142b, the gate insulating layer 138 provided over the source and drain electrode layers 142a and 142b and the oxide semiconductor layer 140, and the gate electrode layer 136d provided over the gate insulating layer 138 so as to overlap with the oxide semiconductor layer 140.

The n-channel transistor 164 illustrated in FIG. 14B includes the oxide semiconductor layer 140 provided over the interlayer insulating layer 128, the source and drain electrode layers 142a and 142b provided to be in contact with the top surface of the oxide semiconductor layer 140, the gate insulating layer 138 provided over the source and drain electrode layers 142a and 142b and the oxide semiconductor layer 140, and the gate electrode layer 136d provided over the gate insulating layer 138 in a region overlapping with the oxide semiconductor layer 140.

Note that also in the structures in FIGS. 14A and 14B, a component is sometimes omitted from the structure in FIG. 7 or the like. Also in this case, a secondary effect such as simplification of a manufacturing process can be obtained.

In this embodiment, the example in which the n-channel transistor 164 is formed over the p-channel transistor 160 to have a stacked structure is described; however, the structures of the p-channel transistor 160 and the n-channel transistor 164 are not limited to the above. For example, the p-channel transistor 160 and the n-channel transistor 164 can be formed over the same planar surface. Further, a structure in which the p-channel transistor 160 and the n-channel transistor 164 overlap with each other may be employed.

The above-described n-channel transistor 164 is applied to the n-channel transistor included in the semiconductor devices described in Embodiments 1 to 4, whereby electric discharge of a battery in the standby state can be suppressed. That is, standby power of the semiconductor devices can be reduced. Further, when electric discharge of a battery in the standby state is suppressed, the semiconductor device can have a long lifetime.

Note that this embodiment or part of this embodiment can be freely combined with the other embodiments or part of the other embodiments.

Embodiment 6

In this embodiment, an example of a transistor included in any of the semiconductor devices described in Embodiments 1 to 4 will be described. Specifically, an example of a transistor in which a channel formation region is formed using an oxide semiconductor will be described.

An embodiment of a transistor and a manufacturing step thereof in this embodiment will be described with reference to FIGS. 15A and 15B and FIGS. 16A to 16E.

Figure 15A:
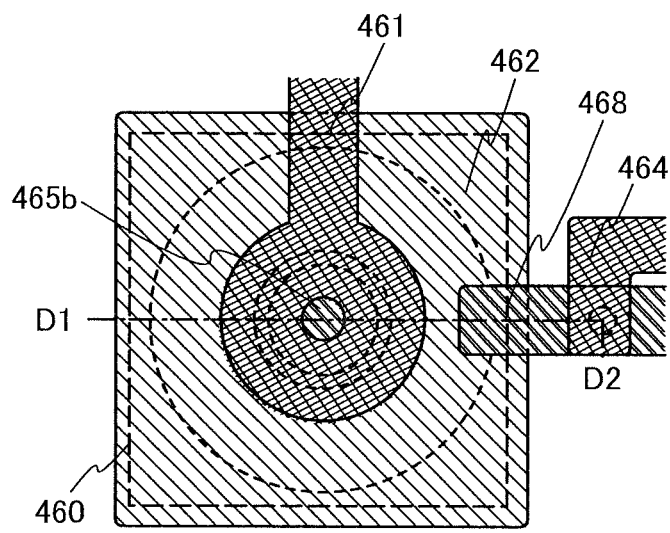
FIGS. 15A and 15B are a plan view and a cross-sectional view illustrating a structure example of a transistor described in Embodiment 6.
Figure 15B:
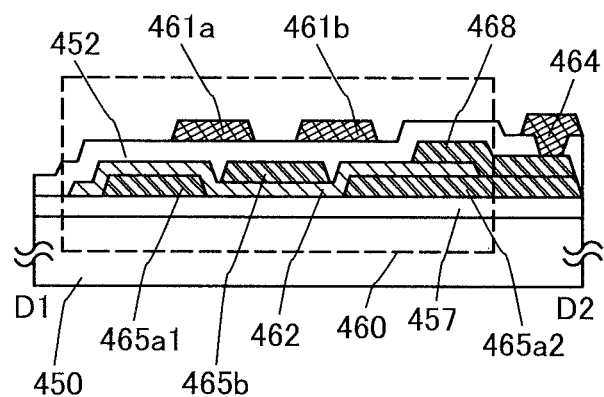

FIGS. 15A and 15B illustrate an example of a planar structure of a transistor and an example of a cross-sectional structure of the transistor, respectively. A transistor 460 illustrated in FIGS. 15A and 15B has a top-gate structure.

FIG. 15A is a plan view of the top-gate transistor 460, and FIG. 15B is a cross-sectional view taken along line D1-D2 in FIG. 15A.

The transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is also electrically connected to a wiring layer in an opening provided in the gate insulating layer 452.

A process of manufacturing the transistor 460 over the substrate 450 is described below with reference to FIGS. 16A to 16E.

First, the insulating layer 457 serving as a base film is formed over the substrate 450 having an insulating surface.

In this embodiment, a silicon oxide layer is formed by a sputtering method as the insulating layer 457. The substrate 450 is transferred into a treatment chamber, a sputtering gas containing high-purity oxygen from which hydrogen and moisture are removed is introduced into the treatment chamber, and a silicon target or quartz (preferably synthetic quartz) is used, so that the silicon oxide layer is formed as the insulating layer 457 over the substrate 450. As the sputtering gas, oxygen or a mixed gas of oxygen and argon is used.

For example, a silicon oxide layer is formed by an RF sputtering method under the following condition: the purity of a sputtering gas is 6N; quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm)). The thickness of the silicon oxide is 100 nm. Note that instead of quartz (preferably, synthetic quartz), a silicon target can be used as a target used when the silicon oxide film is formed.

In that case, the insulating layer 457 is preferably formed while moisture remaining in the treatment chamber is removed. This is for preventing hydrogen, a hydroxyl group, or moisture from being contained in the insulating layer 457. In the treatment chamber which is evacuated with a cryopump, a hydrogen atom, a compound containing a hydrogen atom such as water ($H_2O$), and the like are removed, whereby the concentration of an impurity in the insulating layer 457 formed in the treatment chamber can be reduced.

A sputtering gas used for formation of the insulating layer 457 is preferably a high-purity gas in which the concentration of an impurity such as hydrogen, water, a hydroxyl group, or a hydride is reduced to approximately several parts per million (ppm) or several parts per billion (ppb).

Further, the insulating layer 457 may have a stacked structure in which, for example, a nitride insulating layer such as a silicon nitride layer, a silicon nitride oxide layer, an aluminum nitride layer, or an aluminum nitride oxide layer and an oxide insulating layer are stacked in this order from the substrate 450 side.

For example, a sputtering gas containing high-purity nitrogen, from which hydrogen and moisture are removed, is introduced between the silicon oxide layer and the substrate, and a silicon target is used, whereby a silicon nitride layer is formed. Also in this case, in a manner similar to formation of the silicon oxide layer, it is preferable that the silicon nitride layer be formed while residual moisture in the treatment chamber is removed.

Next, a conductive film is formed over the insulating layer 457. In a first photolithography step, a resist mask is formed over the conductive film and selective etching is performed, so that the source or drain electrode layer 465a1 and 465a2 is formed. Then, the resist mask is removed (see FIG. 16A). It seems in cross section as if the source or drain electrode layer 465a1 and 465a2 is divided; however, the source or drain electrode layer 465a1 and 465a2 is a continuous film. Note that the source electrode layer and the drain electrode layer preferably have tapered shapes in end portions because coverage with the gate insulating layer stacked thereover can be improved.

As the material of the source or drain electrode layer 465a1 and 465a2, an element selected from Al, Cr, Cu, Ta, Ti, Mo, and W, an alloy containing any of the above elements, an alloy film containing any of these elements in combination, and the like can be used. Further, one or more of materials selected from manganese, magnesium, zirconium, beryllium, and thorium may be used. The metal conductive film may have a single-layer structure or a stacked-layer structure of two or more layers. For example, a single-layer structure of an aluminum film containing silicon, a two-layer structure of an aluminum film and a titanium film stacked thereover, a three-layer structure in which a Ti film, an aluminum film, and a Ti film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In this embodiment, a titanium film with a thickness of 150 nm is formed by a sputtering method for the source or drain electrode layer 465a1 and 465a2.

Next, an oxide semiconductor film with a thickness of 2 nm to 200 nm inclusive is formed over the insulating layer 457 and the source or drain electrode layer 465a1 and 465a2.

Figure 16A:
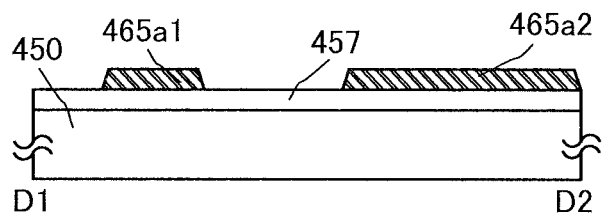
FIGS. 16A to 16E are cross-sectional views illustrating an example of a process of manufacturing a transistor described in Embodiment 6.
Figure 16B:
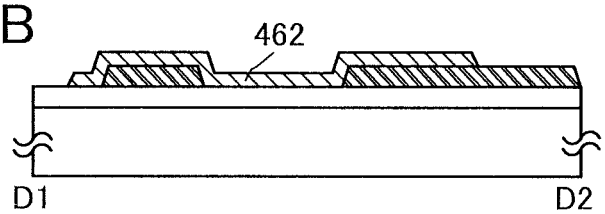
Figure 16C:
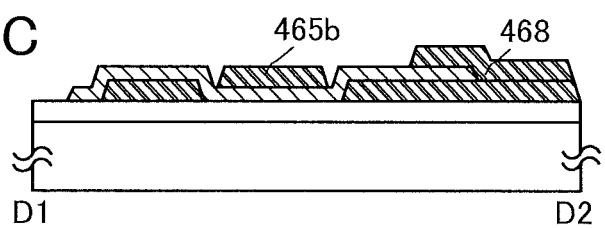

Next, the oxide semiconductor film is processed into an island-shaped oxide semiconductor layer 462 in a second photolithography step (see FIG. 16B). In this embodiment, the oxide semiconductor film is formed by a sputtering method with the use of an In—Ga—Zn—O-based metal oxide target.

The substrate is held in a treatment chamber kept under reduced pressure, a sputtering gas from which hydrogen and moisture are removed is introduced into the treatment chamber while residual moisture in the treatment chamber is removed, whereby the oxide semiconductor film is formed over the substrate 450 with the use of metal oxide as a target. In order to remove residual moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, for example, a hydrogen atom, a compound containing a hydrogen atom such as water ($H_2O$) (preferably, also a compound containing a carbon atom), and the like are removed, whereby the impurity concentration in the oxide semiconductor film formed in the treatment chamber can be reduced. The substrate may be heated when the oxide semiconductor film is formed.

A sputtering gas used for formation of the oxide semiconductor film is preferably a high-purity gas in which the concentration of an impurity such as hydrogen, water, a hydroxyl group, or a hydride is reduced to approximately several parts per million (ppm) or several parts per billion (ppb).

An example of the deposition condition is as follows: the substrate temperature is room temperature, the distance between the substrate and the target is 60 mm, the pressure is 0.4 Pa, the direct current (DC) power is 0.5 kW, and the atmosphere is an atmosphere containing oxygen and argon (an oxygen flow rate of 15 sccm and an argon flow rate of 30 sccm). Note that when a pulse direct current (DC) power supply is used, powder substances (also referred to as particles or dust) generated in film deposition can be reduced and the film thickness can be uniform. The thickness of the oxide semiconductor film is preferably 5 nm to 30 nm inclusive. Note that an appropriate thickness differs depending on an oxide semiconductor material, and the thickness may be set as appropriate depending on the material.

In this embodiment, the oxide semiconductor film is processed into the island-shaped oxide semiconductor layer 462 by a wet etching method with a mixed solution of phosphoric acid, acetic acid, and nitric acid as an etchant.

In this embodiment, the oxide semiconductor layer 462 is subjected to first heat treatment. The temperature of the first heat treatment is higher than or equal to 400° C. and lower than or equal to 750° C., preferably higher than or equal to 400° C. and lower than a strain point of the substrate. Here, the substrate is put in an electric furnace which is a kind of heat treatment apparatus and heat treatment is performed on the oxide semiconductor layer in a nitrogen atmosphere at 450° C. for one hour, and the oxide semiconductor layer is not exposed to air so that water and hydrogen are prevented from entering the oxide semiconductor layer; thus, the oxide semiconductor layer can be obtained. By the first heat treatment, the oxide semiconductor layer 462 can be dehydrated or dehydrogenated.

Note that the heat treatment apparatus is not limited to an electronic furnace, and may be the one provided with a device for heating an object to be processed, using heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. For example, as the first heat treatment, GRTA by which the substrate is transferred into an inert gas heated to a high temperature as high as 650° C. to 700° C., heated for several minutes, and taken out of the inert gas heated to the high temperature may be performed. With GRTA, high-temperature heat treatment for a short time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Depending on conditions of the first heat treatment or the material of the oxide semiconductor layer, the oxide semiconductor layer is crystallized to be a microcrystalline film or a polycrystalline film in some cases.

The first heat treatment of the oxide semiconductor layer may be performed on the oxide semiconductor film which has not been processed into the island-shaped oxide semiconductor layer. In that case, the substrate is taken out of the heating apparatus after the first heat treatment, and then a photolithography step is performed.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 457 and the oxide semiconductor layer 462. In a third photolithography step, a resist mask is formed over the conductive film and selective etching is performed, so that the source or drain electrode layer 465b and the wiring layer 468 are formed. Then, the resist mask is removed (see FIG. 16C). The source or drain electrode layer 465b and the wiring layer 468 may be formed using a material and steps similar to those of the source or drain electrode layer 465a1 and 465a2.

In this embodiment, a titanium film with a thickness of 150 nm is formed by a sputtering method for the source or drain electrode layer 465b and the wiring layer 468. In this embodiment, the same titanium films are used for the source and drain electrode layer 465a1 and 465a2 and the source or drain electrode layer 465b; accordingly, etching selectivity of the source or drain electrode layer 465a1 and 465a2 with respect to the source or drain electrode layer 465b is not obtained. In order to prevent the source or drain electrode layer 465a1 and 465a2 from being etched when the source or drain electrode layer 465b is etched, the wiring layer 468 is provided over a portion of the source or drain electrode layer 465a2, which is not covered with the oxide semiconductor layer 462. In the case where different materials which have high selectivity in etching steps are used for the source or drain electrode layer 465a1 and 465a2 and the source or drain electrode layer 465b, the wiring layer 468 which protects the source or drain electrode layer 465a2 at the time of etching is not necessarily provided.

Note that materials and etching conditions are adjusted as appropriate so that the oxide semiconductor layer 462 is not removed when the conductive film is etched.

In this embodiment, a Ti film is used as the conductive layer, an In—Ga—Zn—O-based oxide semiconductor is used for the oxide semiconductor layer 462, and an ammonia hydrogen peroxide solution (a mixture of ammonia, water, and a hydrogen peroxide solution) is used as an etchant.

Note that in the third photolithography step, only part of the oxide semiconductor layer 462 is etched, whereby an oxide semiconductor layer having a groove (a depressed portion) is formed in some cases. The resist mask used for forming the source or drain electrode layer 465b and the wiring layer 468 may be formed by an inkjet method. Formation of the resist mask by an inkjet method needs no photomask; thus, manufacturing cost can be reduced.

Next, a gate insulating layer 452 is formed over the insulating layer 457, the oxide semiconductor layer 462, the source or drain electrode layer 465a1 and 465a2, the source or drain electrode layer 465b, and the wiring layer 468.

The gate insulating layer 452 can be a single layer or a stacked layer formed using any of a silicon oxide layer, a silicon nitride layer, a silicon oxynitride layer, a silicon nitride oxide layer, and an aluminum oxide layer, which is formed by a plasma CVD method, a sputtering method, or the like. In order to prevent the gate insulating layer 452 from containing a large amount of hydrogen, the gate insulating layer 452 is preferably formed by a sputtering method. In the case where a silicon oxide film is formed by a sputtering method, a silicon target or a quartz target is used as a target, and oxygen or a mixed gas of oxygen and argon is used as a sputtering gas.

The gate insulating layer 452 may have a structure where a silicon oxide layer and a silicon nitride layer are stacked from the side of the source or drain electrode layer 465a1 and 465a2 and the source or drain electrode layer 465b. In this embodiment, a silicon oxide layer with a thickness of 100 nm is formed by an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Figure 16D:
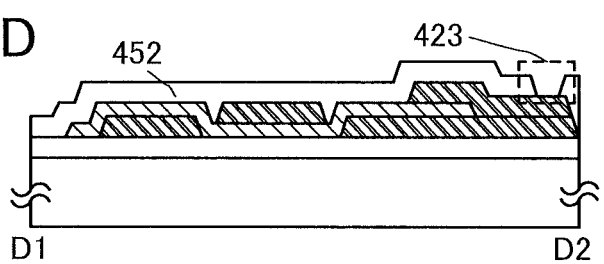

Next, in a fourth photolithography step, a resist mask is formed and selective etching is performed to remove part of the gate insulating layer 452, so that an opening 423 reaching the wiring layer 468 is formed (see FIG. 16D). Although not illustrated, in forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Then, after a conductive film is formed over the gate insulating layer 452 and in the opening 423, the gate electrode layer 461 (461a and 461b) and the wiring layer 464 are formed in a fifth photolithography step. Note that a resist mask may be formed by an inkjet method. Formation of the resist mask by an inkjet method needs no photomask; thus, manufacturing cost can be reduced.

Further, the gate electrode layer 461 (461a and 461b) and the wiring layer 464 can be formed with a single-layer structure or a stacked-layer structure using any of metal materials such as molybdenum, titanium, chromium, tantalum, tungsten, aluminum, copper, neodymium, and scandium, and an alloy material including any of these materials as a main component.

In this embodiment, a titanium film with a thickness of 150 nm is formed by a sputtering method for the gate electrode layer 461 (461a and 461b) and the wiring layer 464.

Next, second heat treatment (preferably at 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the transistor 460.

Further, heat treatment may be performed at 100° C. to 200° C. inclusive for 1 hour to 30 hours in air. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating layer. Under the reduced pressure, the heating time can be shortened.

Figure 16E:
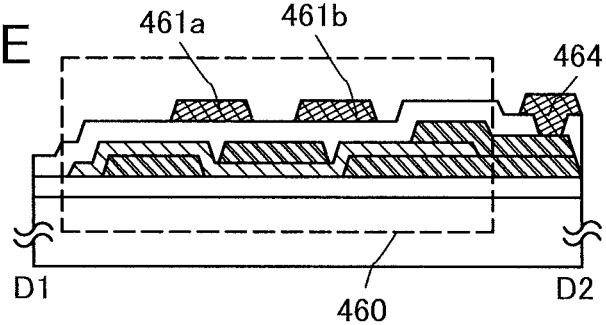

Through the above-described process, the transistor 460 including the oxide semiconductor layer 462 in which the concentration of hydrogen, moisture, a hydride, or a hydroxide is reduced can be formed (see FIG. 16E).

A protective insulating layer or a planarization insulating layer for planarization may be provided over the transistor 460. Although not illustrated, an opening reaching the source or drain electrode layer 465b may be formed in the gate insulating layer 452 and the protective insulating layer or the planarization insulating layer, and a wiring layer for electrical connection to the source or drain electrode layer 465b is formed in the opening.

Moisture remaining in a reaction atmosphere is removed as described above in forming the oxide semiconductor film, whereby the concentration of hydrogen and a hydride in the oxide semiconductor film can be reduced. Therefore, the oxide semiconductor film can be stabilized.

The above-described transistor is applied to the transistor included in the semiconductor devices described in Embodiments 1 to 4, whereby electric discharge of a battery in the standby state can be suppressed. That is, standby power of the semiconductor devices can be reduced. Further, when electric discharge of a battery in the standby state is suppressed, the semiconductor device can have a long lifetime.

Further, the transistors in this embodiment are used as transistors included in the semiconductor devices in Embodiments 1 to 4, whereby reduction in the manufacturing process, improvement in yield, and reduction in manufacturing cost can be achieved.

Note that this embodiment or part of this embodiment can be freely combined with the other embodiments or part of the other embodiments.

Embodiment 7

In this embodiment, an example of a transistor included in any of the semiconductor devices described in Embodiments 1 to 4 will be described. Specifically, an example of a transistor in which a channel formation region is formed using an oxide semiconductor will be described.

An embodiment of a transistor of this embodiment and a manufacturing method thereof will be described with reference to FIGS. 17A to 17E.

FIGS. 17A to 17E illustrate an example of a cross-sectional structure of a transistor. A transistor 390 illustrated in FIG. 17E has a bottom-gate structure and is also referred to as an inverted staggered transistor.

The transistor 390 is described using a single-gate transistor; however, a multi-gate transistor including a plurality of channel formation regions can be formed when needed.

Hereinafter, a process of manufacturing the transistor 390 over a substrate 394 is described with reference to FIGS. 17A to 17E.

First, a conductive film is formed over the substrate 394 having an insulating surface, and then, a gate electrode layer 391 is formed in a first photolithography step. It is preferable that an end portion of the formed gate electrode layer 391 have a tapered shape because coverage with a gate insulating layer stacked thereover is improved. Note that a resist mask may be formed by an inkjet method. Formation of the resist mask by an inkjet method needs no photomask; thus, manufacturing cost can be reduced.

Although there is no particular limitation on a substrate which can be used as the substrate 394 having an insulating surface, the substrate needs to have heat resistance high enough to withstand at least heat treatment to be performed later. A glass substrate formed using barium borosilicate glass, aluminoborosilicate glass, or the like can be used.

In the case where the temperature at which the heat treatment is to be performed later is high, a glass substrate whose strain point is higher than or equal to 730° C. is preferably used. As a glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boron oxide ($B_2O_3$). Therefore, a glass substrate containing more BaO than $B_2O_3$ is preferably used.

Note that as the above glass substrate, a substrate formed of an insulator such as a ceramic substrate, a quartz substrate, or a sapphire substrate may be used. Alternatively, a crystallized glass substrate or the like may be used. Further alternatively, a plastic substrate or the like can be used as appropriate.

An insulating film serving as a base film may be provided between the substrate 394 and the gate electrode layer 391. The base film has a function of preventing diffusion of an impurity element from the substrate 394, and can be formed to have a single-layer structure or a stacked structure including one or more films selected from a silicon nitride film, a silicon oxide film, a silicon nitride oxide film, and a silicon oxynitride film.

The gate electrode layer 391 can be formed with a single layer or a stacked layer using a metal material such as molybdenum, titanium, chromium, tantalum, tungsten, aluminum, copper, neodymium, or scandium, or an alloy material containing any of these materials as a main component.

For example, as a two-layer structure of the gate electrode layer 391, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. Note that the gate electrode layer can be formed using a light-transmitting conductive film. As an example of the light-transmitting conductive film, a light-transmitting conductive oxide film or the like can be given.

Then, the gate insulating layer 397 is formed over the gate electrode layer 391.

The gate insulating layer 397 can be formed with a single-layer structure or a stacked structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 397 from containing a large amount of hydrogen, the gate insulating layer 397 is preferably formed by a sputtering method. For example, in the case where a silicon oxide film is formed by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked from the gate electrode layer 391 side. For example, a gate insulating layer is formed in such a manner that a silicon nitride layer ($SiN_y$ (y>0)) with a thickness of 50 nm to 200 nm inclusive is formed by a sputtering method as a first gate insulating layer and then a silicon oxide layer ($SiO_x$ (x>0)) with a thickness of 5 nm to 300 nm inclusive is stacked as a second gate insulating layer over the first gate insulating layer.

Further, in order for the gate insulating layer 397 and an oxide semiconductor film 393 to contain hydrogen, a hydroxyl group, or moisture as little as possible, it is preferable that the substrate 394 over which the gate insulating layer 391 is formed or the substrate 394 in a state after the gate insulating layer 397 is formed thereover be preheated in a preheating chamber of a sputtering apparatus as pretreatment for film formation so that impurities such as hydrogen or moisture adsorbed to the substrate 394 are eliminated, and then evacuation is performed. Note that the temperature of the preheating is higher than or equal to 100° C. and lower than or equal to 400° C., preferably higher than or equal to 150° C. and lower than or equal to 300° C. As an evacuation unit provided for the preheating chamber, a cryopump is preferably used. Note that this preheating treatment can be omitted. Further, such preheating treatment may be similarly performed on the substrate 394 in a state where a source electrode layer 395a and a drain electrode layer 395b are formed before formation of an oxide insulating layer 396.

Figure 17A:
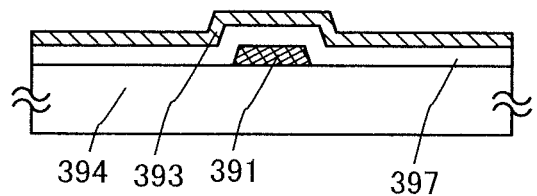
FIGS. 17A to 17E are cross-sectional views illustrating an example of a process of manufacturing a transistor described in Embodiment 7.

Then, the oxide semiconductor film 393 with a thickness of 2 nm to 200 nm inclusive is formed over the gate insulating layer 397 (see FIG. 17A).

Note that before the oxide semiconductor film 393 is formed by a sputtering method, dust on a surface of the gate insulating layer 397 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

The oxide semiconductor film 393 is formed by a sputtering method. The oxide semiconductor film 393 is formed using an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor. In this embodiment, the oxide semiconductor film 393 is formed by a sputtering method using an In—Ga—Zn—O-based metal oxide target. Further, the oxide semiconductor film 393 can be formed by a sputtering method in a rare gas (typically argon) atmosphere, an oxygen atmosphere, or an atmosphere of a rare gas (typically argon) and oxygen. In the case of employing a sputtering method, deposition may be performed with the use of a target including $SiO_2$ at 2 wt % to 10 wt %, inclusive.

As a target for forming the oxide semiconductor film 393 by a sputtering method, a metal oxide target containing zinc oxide as a main component can be used. As another example of the metal oxide target, a metal oxide target containing In, Ga, and Zn (a composition ratio is $In_2O_3$:$Ga_2O_3$:ZnO=1:1:1 [molar ratio], In:Ga:Zn=1:1:0.5 [atomic ratio]) can be used. As the metal oxide target including In, Ga, and Zn, a target having a composition ratio of In:Ga:Zn=1:1:1 [atomic ratio] or a target having a composition ratio of In:Ga:Zn=1:1:2 [atomic ratio] can also be used. The filling factor of the metal oxide target is from 90% to 100% inclusive, and preferably from 95% to 99.9% inclusive. With the use of a metal oxide target with high filling factor, a dense oxide semiconductor film is formed.

The substrate is held in a treatment chamber which is kept in a reduced pressure state, and the substrate is heated to a temperature higher than or equal to room temperature and lower than 400° C. Then, a sputtering gas from which hydrogen and moisture are removed is introduced into the treatment chamber while remaining moisture in the treatment chamber is removed, and the oxide semiconductor film 393 is formed over the substrate 394 with the use of a metal oxide as a target. In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$) (preferably, also a compound containing a carbon atom), and the like are removed, whereby the impurity concentration in the oxide semiconductor film formed in the treatment chamber can be reduced. By film formation using a sputtering method while moisture remaining in the treatment chamber is removed with a cryopump, the substrate temperature at the time of forming the oxide semiconductor film 393 can be higher than or equal to room temperature and lower than 400° C.

As an example of a deposition condition, the distance between the substrate and the target is 100 mm, the pressure is 0.6 Pa, the direct-current (DC) power is 0.5 kW, and the atmosphere is an oxygen atmosphere (the proportion of the oxygen flow is 100%). Note that a pulsed direct current (DC) power supply is preferably used because powder substances (also referred to as particles or dust) generated in film deposition can be reduced and the film thickness can be uniform. The thickness of the oxide semiconductor film is preferably 5 nm to 30 nm inclusive. Note that an appropriate thickness differs depending on an oxide semiconductor material, and the thickness may be set as appropriate depending on the material.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Figure 17B:
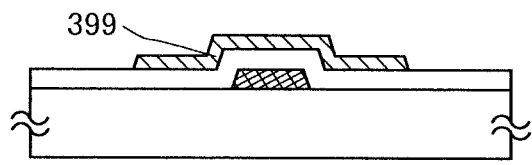
Figure 17C:
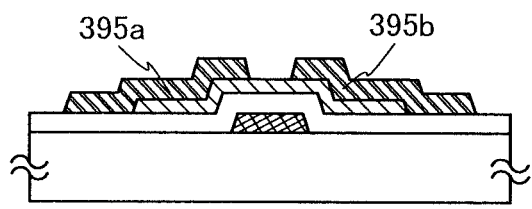

Then, in a second photolithography step, the oxide semiconductor film is processed into an island-shaped oxide semiconductor layer 399 (see FIG. 17B). Note that a resist mask used for formation of the island-shaped oxide semiconductor layer 399 may be formed by an inkjet method. Formation of the resist mask by an inkjet method needs no photomask; thus, manufacturing cost can be reduced.

In the case of forming a contact hole in the gate insulating layer 397, its step can be performed at the time of formation of the oxide semiconductor layer 399.

For etching of the oxide semiconductor film 393, wet etching, dry etching, or both of them may be employed.

As an etching gas for dry etching, a gas containing chlorine (chlorine-based gas such as chlorine ($Cl_2$), boron chloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layer into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the material can be etched into a desired shape.

Note that it is preferable that a resist residue attached to surfaces of the oxide semiconductor layer 399 and the gate insulating layer 397 be removed by performing reverse sputtering before formation of a conductive film in a subsequent step.

Next, a conductive film is formed over the gate insulating layer 397 and the oxide semiconductor layer 399. The conductive film may be formed by a sputtering method or a vacuum evaporation method. As the material of the conductive film, an element selected from Al, Cr, Cu, Ta, Ti, Mo, and W, an alloy containing any of the above elements, an alloy film containing any of these elements in combination, and the like can be used. Further, one or more of materials selected from manganese, magnesium, zirconium, beryllium, and thorium may be used. The metal conductive film may have a single-layer structure or a stacked-layer structure of two or more layers. For example, a single-layer structure of an aluminum film containing silicon, a two-layer structure of an aluminum film and a titanium film stacked thereover, a three-layer structure in which a Ti film, an aluminum film, and a Ti film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In a third photolithography step, a resist mask is formed over the conductive film and selective etching is performed, so that a source electrode layer 395a and a drain electrode layer 395b are formed. Then, the resist mask is removed (see FIG. 17C).

Ultraviolet rays, KrF laser light, or ArF laser light is used for light exposure for forming the resist mask in the third photolithography step. The channel length (L) of a transistor to be formed later is determined by the distance between a lower edge portion of the source electrode layer and a lower edge portion of the drain electrode layer which are adjacent to each other over the oxide semiconductor layer 399. In the case where the channel length (L) is shorter than 25 nm, light exposure for making a mask in the third photolithography step is performed with the use of extreme ultraviolet rays with extremely short wavelength of several nanometers to several tens of nanometers. Light exposure with extreme ultraviolet rays yields high resolution and a great depth of focus. Therefore, the channel length (L) of the transistor, which is formed later, can be from 10 nm to 1000 nm inclusive, and thus the operation rate of the circuit can be increased. In addition, the off current value is extremely small; thus, lower power consumption can be achieved.

Note that materials and etching conditions are adjusted as appropriate so that the oxide semiconductor layer 399 is not removed when the conductive film is etched.

In this embodiment, a Ti film is used as the conductive layer, an In—Ga—Zn—O-based oxide semiconductor is used for the oxide semiconductor layer 399, and an ammonia hydrogen peroxide solution (a mixture of ammonia, water, and a hydrogen peroxide solution) is used as an etchant.

Note that in the third photolithography step, only part of the oxide semiconductor layer 399 is etched, whereby an oxide semiconductor layer having a groove (a depressed portion) is formed in some cases. The resist mask used for forming the source electrode layer 395a and the drain electrode layer 395b may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps to provide different patterns. Accordingly, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Plasma treatment using a gas such as $N_2O$, $N_2$, or Ar may be performed to remove water or the like adsorbed on a surface of the oxide semiconductor layer which is exposed. Plasma treatment may be performed using a mixture gas of oxygen and argon.

Figure 17D:
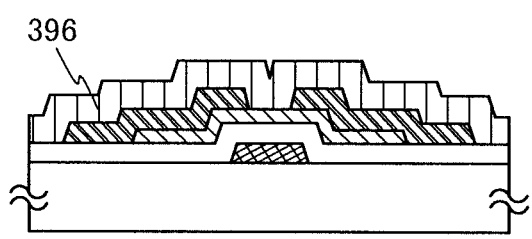

In the case of performing plasma treatment, the oxide insulating layer 396, which serves a protective insulating layer, in contact with part of the oxide semiconductor layer is formed without exposure to air (see FIG. 17D). In this embodiment, the oxide insulating layer 396 is formed in contact with the oxide semiconductor layer 399 in a region where the oxide semiconductor layer 399 is overlapped with neither the source electrode layer 395a nor the drain electrode layer 395b.

In this embodiment, the substrate 394 over which layers up to the island-shaped oxide semiconductor layer 399, the source electrode layer 395a, and the drain electrode layer 395b are formed is heated to a temperature higher than or equal to room temperature and lower than 100° C., and a sputtering gas containing high-purity oxygen in which hydrogen and moisture are removed is introduced, so that a silicon oxide layer including a defect is formed as the oxide insulating layer 396 with the use of a silicon target.

For example, a silicon oxide layer is formed by a pulsed DC sputtering method under the following condition: a silicon target doped with boron and having a purity of 6N (99.9999%) (resistivity: 0.01 Ωcm) is used, the distance between the target and the substrate (T-S distance) is 89 mm, the pressure is 0.4 Pa, the direct current (DC) power supply is 6 kW, and an atmosphere is an oxygen atmosphere (the proportion of the oxygen flow is 100%). The thickness of the silicon oxide layer is 300 nm. Instead of the silicon target, quartz (preferably, synthetic quartz) can be used as the target for forming the silicon oxide layer. As the sputtering gas, oxygen or a mixed gas of oxygen and argon is used.

In this case, it is preferable that the oxide insulating layer 396 be formed while residual moisture in the treatment chamber is removed. This is because hydrogen, a hydroxyl group, or moisture is prevented from being contained in the oxide semiconductor layer 399 and the oxide insulating layer 396.

In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$), and the like are removed, whereby the impurity concentration in the oxide insulating layer 396 formed in the treatment chamber can be reduced.

Instead of the silicon oxide layer, a silicon oxynitride layer, an aluminum oxide layer, an aluminum oxynitride layer, or the like can be used as the oxide insulating layer 396.

Furthermore, heat treatment may be performed at a temperature of 100° C. to 400° C. under such a condition that the oxide insulating layer 396 and the oxide semiconductor layer 399 are in contact with each other. Since the oxide insulating layer 396 includes many defects in this embodiment, an impurity such as hydrogen, moisture, a hydroxyl group, or a hydride included in the oxide semiconductor layer 399 is diffused into the oxide insulating layer 396 by this heat treatment, so that the impurity in the oxide semiconductor layer 399 can be further reduced.

Figure 17E:
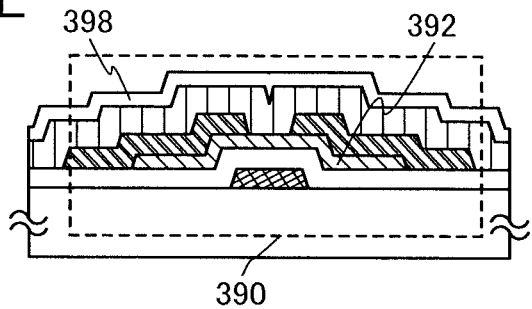

Through the above-described process, the transistor 390 including the oxide semiconductor layer 392 in which the concentration of hydrogen, moisture, a hydroxyl group, or a hydride is reduced can be formed (see FIG. 17E).

Moisture remaining in a reaction atmosphere is removed as described above in forming the oxide semiconductor film, whereby the concentration of hydrogen and a hydride in the oxide semiconductor film can be reduced. Therefore, the oxide semiconductor film can be stabilized.

A protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, an aluminum nitride oxide film, or the like is used.

As the protective insulating layer 398, a silicon nitride film is formed using a silicon semiconductor target in such a manner that the substrate 394 over which layers up to the oxide insulating layer 396 are formed is heated to a temperature of 100° C. to 400° C. and a sputtering gas from which hydrogen and moisture are removed and which contains high-purity nitrogen is introduced. In this case, it is preferable that residual moisture be removed from the treatment chamber in the formation of the protective insulating layer 398 in a manner similar to that of the oxide insulating layer 396.

In the case of forming the protective insulating layer 398, the substrate 394 is heated to a temperature of 100° C. to 400° C. at the time of formation of the protective insulating layer 398, whereby hydrogen or moisture included in the oxide semiconductor layer can be diffused into the oxide insulating layer. In this case, heat treatment is not necessarily performed after formation of the oxide insulating layer 396.

In the case where a silicon oxide layer as the oxide insulating layer 396 and a silicon nitride layer as the protective insulating layer 398 are stacked, the silicon oxide layer and the silicon nitride layer can be formed in the same treatment chamber using a common silicon target. First, a sputtering gas containing oxygen is introduced and a silicon oxide layer is formed using a silicon target placed inside the treatment chamber, and then the sputtering gas is switched to a sputtering gas containing nitrogen and a silicon nitride layer is formed using the same silicon target. Since the silicon oxide layer and the silicon nitride layer can be formed in succession without exposure to air, an impurity such as hydrogen or moisture can be prevented from being adsorbed on a surface of the silicon oxide layer. In this case, after the silicon oxide layer as the oxide insulating layer 396 and the silicon nitride layer as the protective insulating layer 398 are stacked, heat treatment (at a temperature of 100° C. to 400° C.) for diffusing hydrogen or moisture included in the oxide semiconductor layer into the oxide insulating layer may be performed.

After the formation of the protective insulating layer, heat treatment may be further performed at 100° C. to 200° C. inclusive for 1 hour to 30 hours in air. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating layer. Under the reduced pressure, the heating time can be shortened. With this heat treatment, a normally-off transistor can be obtained. Therefore, reliability of the semiconductor device can be improved.

When the oxide semiconductor layer serving as the channel formation region is formed over the gate insulating layer, remaining moisture in a reaction atmosphere is removed; thus, the concentration of hydrogen and a hydride in the oxide semiconductor layer can be reduced.

The above steps can be used for manufacture of a liquid crystal display panel, an electroluminescence display panel, and a backplane (a substrate over which a transistor is formed) of a display device using electronic ink. The above steps are performed at 400° C. or lower; therefore, the above steps can be applied to a manufacturing process in which a glass substrate having a thickness of 1 mm or smaller and having a side that is longer than 1 m is used. All the above steps can be performed at 400° C. or lower; thus, a large amount of energy is not needed for manufacturing a display panel.

The above-described transistor is applied to the transistor included in the semiconductor devices described in Embodiments 1 to 4, whereby electric discharge of a battery in the standby state can be suppressed. That is, standby power of the semiconductor devices can be reduced. Further, when electric discharge of a battery in the standby state is suppressed, the semiconductor device can have a long lifetime.

Further, the transistors described above are used as transistors included in the semiconductor devices in Embodiments 1 to 4, whereby reduction in the manufacturing process, improvement in yield, and reduction in manufacturing cost can be achieved.

Note that this embodiment or part of this embodiment can be freely combined with the other embodiments or part of the other embodiments.

Embodiment 8

In this embodiment, an example of a transistor included in any of the semiconductor devices described in Embodiments 1 to 4 will be described. Specifically, an example of a transistor in which a channel formation region is formed using an oxide semiconductor will be described.

An embodiment of a transistor of this embodiment and a manufacturing method thereof will be described with reference to FIGS. 18A to 18D.

Figure 18A:
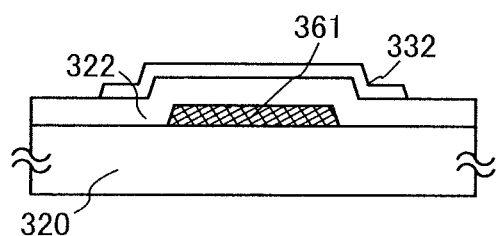
FIGS. 18A to 18D are cross-sectional views illustrating an example of a process of manufacturing a transistor described in Embodiment 8.
Figure 18B:
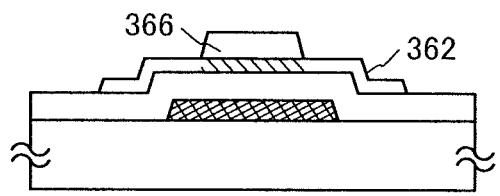
Figure 18C:
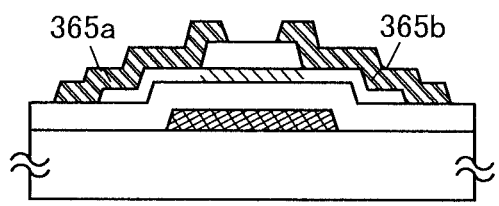
Figure 18D:
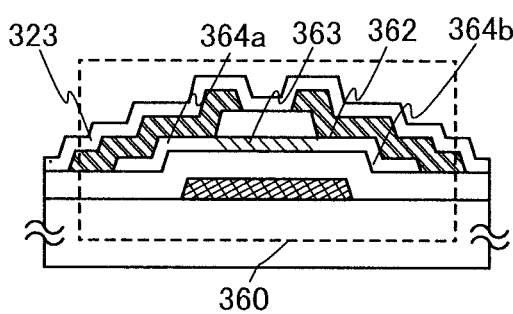
Figure 19A:
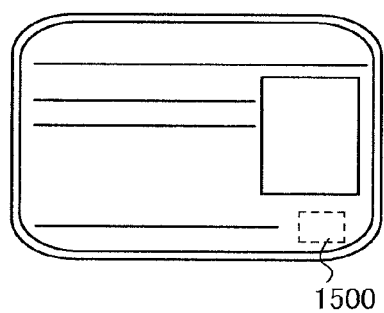
FIGS. 19A to 19F each illustrate an application example of a semiconductor device described in Embodiment 9.
Figure 19B:
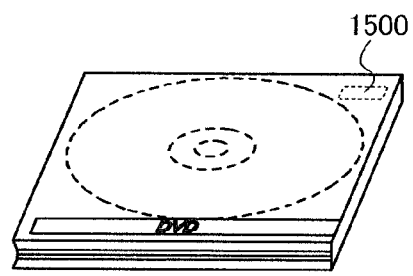
Figure 19C:
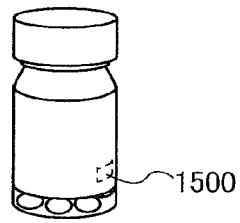
Figure 19D:
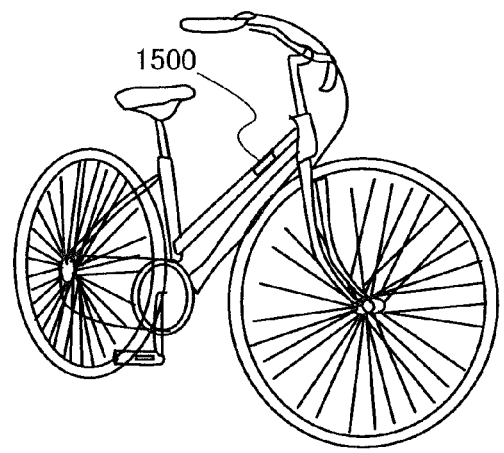
Figure 19E:
Figure 19F:
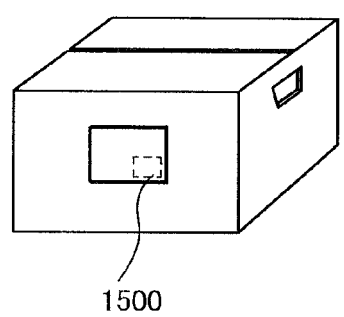

FIGS. 18A to 18D illustrate an example of a cross-sectional structure of a transistor. A transistor 360 illustrated in FIG. 18D is a kind of bottom-gate structure referred to as a channel-protective type (channel-stop type) and is also referred to as an inverted staggered transistor.

The transistor 360 is described using a single-gate transistor; however, a multi-gate transistor including a plurality of channel formation regions can be formed when needed.

Hereinafter, a process of manufacturing the transistor 360 over a substrate 320 will be described with reference to FIGS. 18A to 18D.

First, a conductive film is formed over the substrate 320 having an insulating surface, and then, in a first photolithography step, a gate electrode layer 361 is formed. Note that a resist mask may be formed by an inkjet method. Formation of the resist mask by an inkjet method needs no photomask; thus, manufacturing cost can be reduced.

The gate electrode layer 361 can be formed to have a single-layer or stacked-layer structure using a metal material such as molybdenum, titanium, chromium, tantalum, tungsten, aluminum, copper, neodymium, or scandium, or an alloy material containing any of these materials as its main component.

Next, a gate insulating layer 322 is formed over the gate electrode layer 361.

In this embodiment, a silicon oxynitride layer with a thickness of 100 nm or smaller is formed by a plasma CVD method as the gate insulating layer 322.

Next, an oxide semiconductor film with a thickness of from 2 nm to 200 nm is formed over the gate insulating layer 322 and is processed into an island-shaped oxide semiconductor layer in a second photolithography step. In this embodiment, the oxide semiconductor film is formed using an In—Ga—Zn—O-based metal oxide target by a sputtering method.

In this case, it is preferable that the oxide semiconductor film be formed while residual moisture in a treatment chamber is removed. This is because hydrogen, a hydroxyl group, and moisture are prevented from being included in the oxide semiconductor film.

In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$), and the like are removed, whereby the impurity concentration in the oxide semiconductor film formed in the treatment chamber can be reduced.

A sputtering gas used for formation of the oxide semiconductor film is preferably a high-purity gas in which the concentration of an impurity such as hydrogen, water, a hydroxyl group, or a hydride is reduced to approximately several parts per million (ppm) or several parts per billion (ppb).

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than a strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to air so that entry of water and hydrogen into the oxide semiconductor layer is prevented; thus, an oxide semiconductor layer 332 is obtained (see FIG. 18A).

Next, plasma treatment is performed using a gas such as $N_2O$, $N_2$, or Ar. By this plasma treatment, adsorbed water and the like attached to an exposed surface of the oxide semiconductor layer are removed. Plasma treatment may be performed using a mixed gas of oxygen and argon as well.

Next, an oxide insulating layer is formed over the gate insulating layer 322 and the oxide semiconductor layer 332. After that, in a third photolithography step, a resist mask is formed and selective etching is performed, so that an oxide insulating layer 366 is formed. Then, the resist mask is removed.

In this embodiment, as the oxide insulating layer 366, a silicon oxide film with a thickness of 200 nm is formed by a sputtering method. The substrate temperature in deposition may be higher than or equal to room temperature and lower than or equal to 300° C. In this embodiment, the substrate temperature is 100° C. The silicon oxide film can be formed by a sputtering method in a rare gas (typically argon) atmosphere, an oxygen atmosphere, or an atmosphere of a rare gas (typically argon) and oxygen. As a target, a silicon oxide target or a silicon target may be used. For example, silicon oxide can be formed by a sputtering method using a silicon target in an atmosphere of oxygen and nitrogen.

In this case, it is preferable that the oxide insulating layer 366 be formed while residual moisture in the treatment chamber is removed. This is because hydrogen, a hydroxyl group, or moisture is prevented from being included in the oxide semiconductor layer 332 and the oxide insulating layer 366.

In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the use of the cryopump, a hydrogen atom, a compound containing a hydrogen atom such as water ($H_2O$), and the like are removed, whereby the impurity concentration in the oxide insulating layer 366 formed in the treatment chamber can be reduced.

A sputtering gas used for formation of the oxide insulating layer 366 is preferably a high-purity gas in which the concentration of an impurity such as hydrogen, water, a hydroxyl group, or a hydride is reduced to approximately several parts per million (ppm) or several parts per billion (ppb).

Next, second heat treatment may be performed in an inert gas atmosphere or an oxygen gas atmosphere (preferably at a temperature higher than or equal to 200° C. and lower than or equal to 400° C., for example at a temperature higher than or equal to 250° C. and lower than or equal to 350° C.). For example, the second heat treatment is performed in a nitrogen atmosphere at 250° C. for one hour. When the second heat treatment is performed, heat is applied under such a condition that part of the oxide semiconductor layer (a channel formation region) is in contact with the oxide insulating layer 366.

In this embodiment, the oxide semiconductor layer 332 which is provided with the oxide insulating layer 366 and is partly exposed is further subjected to heat treatment in a nitrogen atmosphere or an inert gas atmosphere or under reduced pressure. By the heat treatment in a nitrogen atmosphere or an inert gas atmosphere or under reduced pressure, the resistance of the exposed region of the oxide semiconductor layer 332, which is not covered with the oxide insulating layer 366, can be reduced. For example, heat treatment is performed at 250° C. in a nitrogen atmosphere for one hour.

By the heat treatment for the oxide semiconductor layer 332 provided with the oxide insulating layer 366 in a nitrogen atmosphere, the resistance of the exposed region of the oxide semiconductor layer 332 is reduced. Thus, an oxide semiconductor layer 362 including regions with different resistances (indicated as a shaded region and white regions in FIG. 18B) is formed.

Next, a conductive film is formed over the gate insulating layer 322, the oxide semiconductor layer 362, and the oxide insulating layer 366. After that, in a fourth photolithography step, a resist mask is formed and selective etching is performed, so that a source electrode layer 365*a* and a drain electrode layer 365*b* are formed. Then, the resist mask is removed (see FIG. 18C).

As a material of the source electrode layer 365*a* and the drain electrode layer 365*b*, an element selected from Al, Cr, Cu, Ta, Ti, Mo, and W, an alloy containing any of these elements as a component, an alloy film containing any of these elements in combination, and the like can be given. The metal conductive film may have a single-layer structure or a stacked-layer structure of two or more layers.

Through the above steps, after heat treatment for dehydration or dehydrogenation is performed on the deposited oxide semiconductor film to reduce the resistance of the oxide semiconductor film, part of the oxide semiconductor film is selectively made to be in an oxygen excess state. As a result, a channel formation region 363 overlapping with the gate electrode layer 361 becomes i-type, and a high-resistance source region 364*a* overlapping with the source electrode layer 365*a* and a high-resistance drain region 364*b* overlapping with the drain electrode layer 365*b* are formed in a self-aligned manner. Through the above-described steps, the transistor 360 is formed.

Further, heat treatment may be performed at 100° C. to 200° C. inclusive for 1 hour to 30 hours in air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating film. Under the reduced pressure, the heating time can be shortened. With this heat treatment, hydrogen is introduced from the oxide semiconductor layer to the oxide insulating layer; thus, a normally-off transistor can be obtained. Therefore, reliability of the semiconductor device can be improved.

Note that by formation of the high-resistance drain region 364b (and the high-resistance source region 364a) in the oxide semiconductor layer overlapping with the drain electrode layer 365b (and the source electrode layer 365a), reliability of the transistor can be improved. Specifically, formation of the high-resistance drain region 364b enables such a structure that conductivity gradually varies from the drain electrode layer to the channel formation region 363 via the high-resistance drain region 364b. Thus, in the case where operation is performed with the drain electrode layer 365b connected to a wiring for supplying a high power supply potential VDD, the high-resistance drain region serves as a buffer, and thus local concentration of an electric field hardly occurs even when high voltage is applied between the gate electrode layer 361 and the drain electrode layer 365b, which leads to an increase in withstand voltage of the transistor.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 18D).

Further, an oxide insulating layer may be formed over the source electrode layer 365a, the drain electrode layer 365b, and the oxide insulating layer 366, and the protective insulating layer 323 may be further stacked over the oxide insulating layer.

The above-described transistor is applied to the transistor included in the semiconductor devices described in Embodiments 1 to 4, whereby electric discharge of a battery in the standby state can be suppressed. That is, standby power of the semiconductor devices can be reduced. Further, when electric discharge of a battery in the standby state is suppressed, the semiconductor device can have a long lifetime.

Further, the transistors described above are used as transistors included in the semiconductor devices in Embodiments 1 to 4, whereby reduction in the manufacturing process, improvement in yield, and reduction in manufacturing cost can be achieved.

Note that this embodiment or part of this embodiment can be freely combined with the other embodiments or part of the other embodiments.

Embodiment 9

In this embodiment, usage examples of the semiconductor devices described in Embodiments 1 to 4 are described with reference to FIGS. 19A to 19F.

As shown in FIGS. 19A to 19F, the semiconductor device can be widely used. The semiconductor device can be provided for, for example, bills, coins, securities, bearer bonds, certificates (e.g., driver's licenses or resident cards, see FIG. 19A), recording media (e.g., DVDs or video tapes, see FIG. 19B), containers for wrapping objects (e.g., wrapping paper or bottles, see FIG. 19C), vehicles (e.g., bicycles, see FIG. 19D), personal belongings (e.g., bags or glasses), foods, plants, animals, human bodies, clothes, commodities, or electronic devices (e.g., liquid crystal display devices, EL display devices, television receivers, or mobile phones), or shipping tags of objects (see FIGS. 19E and 19F).

A semiconductor device 1500 is fixed to an object by being mounted on a printed board, being attached to a surface, or being incorporated into the object. For example, the semiconductor device 1500 is incorporated in paper of a book or an organic resin package to be fixed to each object. Since the semiconductor device 1500 achieves reduction in size, thickness, and weight, the design of an object is not impaired even after the semiconductor device 1500 is fixed to the object. Further, by providing the semiconductor device 1500 for bills, coins, securities, bearer bonds, certificates, and the like, an identification function can be obtained and forgery thereof can be prevented by utilizing the identification function. Further, when the semiconductor device of the present invention is attached to containers for wrapping objects, recording media, personal belongings, foods, clothes, commodities, electronic devices, or the like, a system such as an inspection system can be carried out more effectively. In addition, even for a vehicle, the level of security against theft or the like can be raised when the semiconductor device 1500 is attached to the vehicle.

When the semiconductor device described in the above embodiments is used for application usage described in this embodiment in the described manner, data which is used for exchanging information can be maintained at an accurate value. Therefore, authenticity or security of an object can be increased.

Note that this embodiment or part of this embodiment can be freely combined with the other embodiments or part of the other embodiments.

This application is based on Japanese Patent Application serial no. 2009-265594 filed with Japan Patent Office on Nov. 20, 2009, the entire contents of which are hereby incorporated by reference.

EXPLANATION OF REFERENCE

10: antenna, 11: battery, 12: modulation circuit, 13: signal processing portion, 14: power control circuit, 15: transistor, 20: antenna, 21: battery, 22: timer, 23: signal processing portion, 24: power control circuit, 25: transistor, 30: antenna, 31: secondary battery, 32: rectifier circuit, 33: charge circuit, 34: stabilizing power supply circuit, 35: demodulation circuit, 36: signal processing portion, 37: power control circuit, 38: transistor, 40: antenna, 41: secondary battery, 42: rectifier circuit, 43: charge circuit, 44: stabilizing power supply circuit, 45: demodulation circuit, 46: signal processing portion, 47: power control circuit, 48: logic circuit, 49: clock generation circuit, 50: sensor, 51: memory circuit, 52: modulation circuit, 80: p-channel transistor, 81: n-channel transistor, 82: n-channel transistor, 83: p-channel transistor, 84: p-channel transistor, 85: n-channel transistor, 86: n-channel transistor, 87: n-channel transistor, 88: p-channel transistor, 89: p-channel transistor, 90: n-channel transistor, 91: n-channel transistor, 92: n-channel transistor, 100: substrate, 102: protective layer, 104: semiconductor region, 106: element isolation insulating layer, 108a: gate insulating layer, 108b: insulating layer, 110a: gate electrode layer, 110b: electrode layer, 112: insulating layer, 114a: impurity region, 114b: impurity region, 116: channel formation region, 118: sidewall insulating layer, 120a: high-concentration impurity region, 120b: high-concentration impurity region, 122: metal layer, 124a: metal compound region, 124b: metal compound region, 126: interlayer insulating layer, 128: interlayer insulating layer, 130a: source electrode layer, 130b: drain electrode layer, 130c: electrode layer, 132: insulating layer, 134: conductive layer, 136a: electrode layer, 136b: electrode layer, 136c: electrode layer, 136d: gate electrode layer, 138: gate insulating layer, 140: oxide semiconductor layer, 142a: source electrode layer, 142b: drain electrode layer, 144: protective insulating layer, 146: interlayer insulating layer, 148: conductive layer, 150a: electrode layer, 150b: electrode layer, 150c: electrode layer, 150d: electrode layer, 150e: electrode layer, 152: insulating layer, 154a: electrode layer, 154b: electrode layer, 154c: electrode layer, 154d: electrode layer, 160: p-channel transistor, 164: n-channel transistor, 320: substrate, 322: gate insulating layer, 323: protective insulating layer, 332: oxide semiconductor layer, 360: transistor, 361: gate electrode layer, 362: oxide semiconductor layer, 363: channel formation region, 364a: source region, 364b: drain region, 365a: source electrode layer, 365b: drain electrode layer, 366: oxide insulating layer, 390: transistor, 391: gate electrode layer, 392: oxide semiconductor layer, 393: oxide semiconductor film, 394: substrate, 395a: source electrode layer, 395b: drain electrode layer, 396: oxide insulating layer, 397: gate insulating layer, 398: protective insulating layer, 399: oxide semiconductor layer, 423: opening, 450: substrate, 452: gate insulating layer, 457: insulating layer, 460: transistor, 461: gate electrode layer, 461a: gate electrode layer, 461b: gate electrode layer, 462: oxide semiconductor layer, 464: wiring layer, 465a: source electrode layer or drain electrode layer, 465a1: source electrode layer or drain electrode layer, 465a2: source electrode layer or drain electrode layer, 465b: source electrode layer or drain electrode layer, 468: wiring layer, and 1500: semiconductor device.

The invention claimed is:

1. A semiconductor device comprising:
an antenna; and
a circuit comprising a memory configured to store data, the circuit comprising a first transistor and a second transistor,
wherein the antenna is electrically connected to the circuit,
wherein the first transistor is provided over the second transistor,
wherein a channel formation region of the first transistor comprises an oxide semiconductor,
wherein a channel formation region of the second transistor comprises silicon, and
wherein the first transistor is electrically connected to the second transistor.

2. The semiconductor device according to claim 1, wherein a hydrogen concentration in the oxide semiconductor is lower than or equal to $5 \times 10^{19}$ atoms/cm$^3$.

3. The semiconductor device according to claim 1, wherein the oxide semiconductor comprises indium and zinc.

4. The semiconductor device according to claim 1, wherein the silicon is a single crystal silicon.

5. The semiconductor device according to claim 1, wherein the second transistor is a p-channel transistor.

6. The semiconductor device according to claim 1, further comprising a demodulation circuit electrically connected to the antenna and the circuit.

7. A semiconductor device comprising:
an antenna; and
a circuit comprising a memory configured to store data, the circuit comprising a first transistor and a second transistor,
wherein the antenna is electrically connected to the circuit,
wherein the first transistor is provided over the second transistor,
wherein a channel formation region of the first transistor comprises an oxide semiconductor,
wherein a channel formation region of the second transistor comprises silicon, and
wherein the first transistor is electrically connected to a gate electrode of the second transistor.

8. The semiconductor device according to claim 7, wherein a hydrogen concentration in the oxide semiconductor is lower than or equal to $5 \times 10^{19}$ atoms/cm$^3$.

9. The semiconductor device according to claim 7, wherein the oxide semiconductor comprises indium and zinc.

10. The semiconductor device according to claim 7, wherein the silicon is a single crystal silicon.

11. The semiconductor device according to claim 7, wherein the second transistor is a p-channel transistor.

12. The semiconductor device according to claim 7, further comprising a demodulation circuit electrically connected to the antenna and the circuit.

13. A semiconductor device comprising:
an antenna; and
a circuit comprising a memory configured to store data, the circuit comprising a first transistor, a second transistor and a third transistor,
wherein the antenna is electrically connected to the circuit,
wherein the first transistor is provided over the second transistor and the third transistor,
wherein a channel formation region of the first transistor comprises an oxide semiconductor,
wherein a channel formation region of the second transistor comprises silicon,
wherein a channel formation region of the third transistor comprises silicon,
wherein the second transistor is electrically connected to the third transistor, and
wherein the first transistor is electrically connected to a gate electrode of the second transistor.

14. The semiconductor device according to claim 13, wherein a hydrogen concentration in the oxide semiconductor is lower than or equal to $5 \times 10^{19}$ atoms/cm$^3$.

15. The semiconductor device according to claim 13, wherein the oxide semiconductor comprises indium and zinc.

16. The semiconductor device according to claim 13, wherein the silicon is a single crystal silicon.

17. The semiconductor device according to claim 13, wherein each of the second transistor and the third transistor is a p-channel transistor.

18. The semiconductor device according to claim 13, further comprising a demodulation circuit electrically connected to the antenna and the circuit.

* * * * *

UNITED STATES PATENT AND TRADEMARK OFFICE
CERTIFICATE OF CORRECTION

PATENT NO. : 8,892,158 B2
APPLICATION NO. : 13/916666
DATED : November 18, 2014
INVENTOR(S) : Kiyoshi Kato et al.

It is certified that error appears in the above-identified patent and that said Letters Patent is hereby corrected as shown below:

In the Specification

Column 9, line 65, replace "re-channel" with --n-channel--;

Column 10, line 21, replace "re-channel" with --n-channel--;

Column 11, line 14, replace "re-channel" with --n-channel--; and

Column 14, line 13, replace "re-channel" with --n-channel--.

Signed and Sealed this
Twenty-seventh Day of October, 2015

Michelle K. Lee
*Director of the United States Patent and Trademark Office*